(12) United States Patent
Yin et al.

(10) Patent No.: US 11,289,529 B2
(45) Date of Patent: Mar. 29, 2022

(54) PIXEL CIRCUIT, SENSING DEVICE, AND METHOD THEREOF

(71) Applicant: TAIWAN SEMICONDUCTOR MANUFACTURING COMPANY LTD., Hsinchu (TW)

(72) Inventors: Chin Yin, Tainan (TW); Chih-Lin Lee, Miaoli County (TW); Shang-Fu Yeh, Hsin Chu (TW); Meng-Hsiu Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 41 days.

(21) Appl. No.: 16/837,912

(22) Filed: Apr. 1, 2020

(65) Prior Publication Data

US 2021/0313379 A1    Oct. 7, 2021

(51) Int. Cl.
*H01L 27/146* (2006.01)
*H04N 5/355* (2011.01)
*H04N 5/378* (2011.01)

(52) U.S. Cl.
CPC .... *H01L 27/14643* (2013.01); *H01L 27/1463* (2013.01); *H01L 27/14612* (2013.01); *H01L 27/14683* (2013.01); *H04N 5/3559* (2013.01); *H04N 5/378* (2013.01)

(58) Field of Classification Search
CPC ........... H01L 27/14643; H01L 27/1463; H01L 27/14683; H01L 27/14612; H04N 5/3559; H04N 5/378
See application file for complete search history.

(56) References Cited

U.S. PATENT DOCUMENTS 9,723,233 B2 *    8/2017    Grauer .............. H01L 27/14621

OTHER PUBLICATIONS

Takeo Ushinaga, Izhal Abdul Halin, Tomonari Sawada, Shoji Kawahito, Mitsuru Homma, Yasunari Maeda, "A QVGA-size CMOS time-of-flight range image sensor with background light charge draining structure", Proc. SPIE 6056, Three-Dimensional Image Capture and Applications VII, 605604, Jan. 26, 2006; doi: 10.1117/12.642022.
Melexis (2017), "Application note: Time-of-flight basics", 2017.

* cited by examiner

*Primary Examiner* — Tony Ko
(74) *Attorney, Agent, or Firm* — WPAT, P.C., Intellectual Property Attorneys; Anthony King

(57) ABSTRACT

A pixel circuit includes: a photodiode capable of generating electrical current according to an incoming light signal; a control circuit coupled to the photodiode for selectively coupling a cathode of the photodiode to a first reference voltage to generate the electrical current according to a first control signal; and an output circuit coupled to the control circuit for selectively coupling a second reference voltage to a connecting terminal between the control circuit and the output circuit and to generate an output signal according to a reset signal and a select signal.

20 Claims, 15 Drawing Sheets

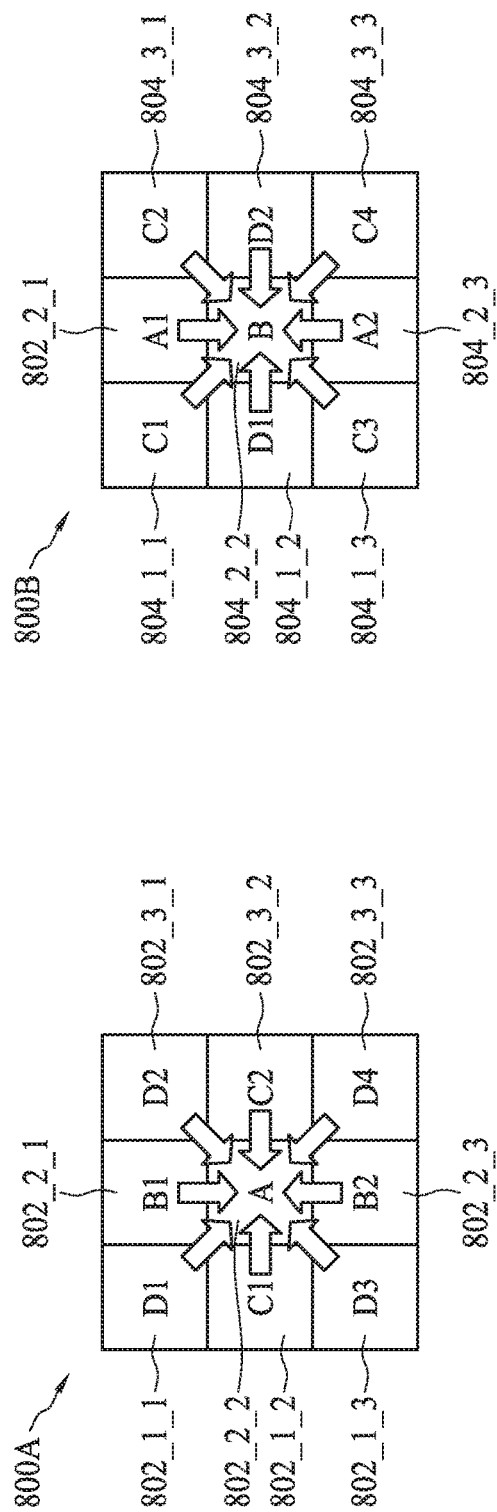
FIG. 8A
FIG. 8B
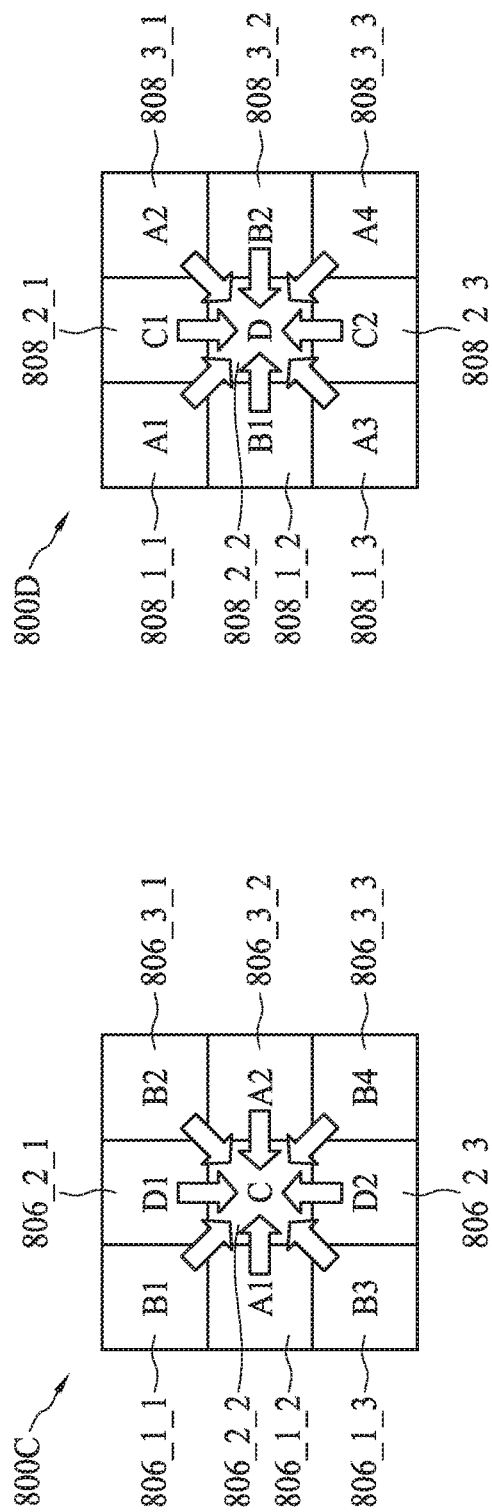
FIG. 8C
FIG. 8D

PIXEL CIRCUIT, SENSING DEVICE, AND METHOD THEREOF

BACKGROUND

A time-of-flight (ToF) system includes a light source and a ToF sensor. The light source emits light pulses towards a target, which reflects the light pulses back towards the ToF sensor. The ToF sensor receives the light pulses after a time of flight. A 3D ToF camera acquires depth images by determining the time which radiation needs from a source to the target and back to the camera. This may be done by illuminating the scene discontinuously and applying a convolution of a temporal window to the backscattered incident optical signal, Continuous-wave ToF cameras illuminate the scene using a periodically modulated light-source, and measure the phase shift of the backscattered signal relative to the emitted signal. The phase shift is proportional to the time-of-flight, so it contains the distance information.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8A is a diagram illustrating a portion of a pixel array arranged for calculating the depth detected by a first-phase pixel in accordance with some embodiments.

FIG. 8B is a diagram illustrating a portion of a pixel array arranged for calculating the depth detected by a second-phase pixel in accordance with some embodiments.

FIG. 8C is a diagram illustrating a portion of a pixel array arranged for calculating the depth detected by a third-phase pixel in accordance with some embodiments, FIG. 8D is a diagram illustrating a portion of a pixel array arranged for calculating the depth detected by a fourth-phase pixel in accordance with some embodiments.

DETAILED DESCRIPTION

Figure 1:
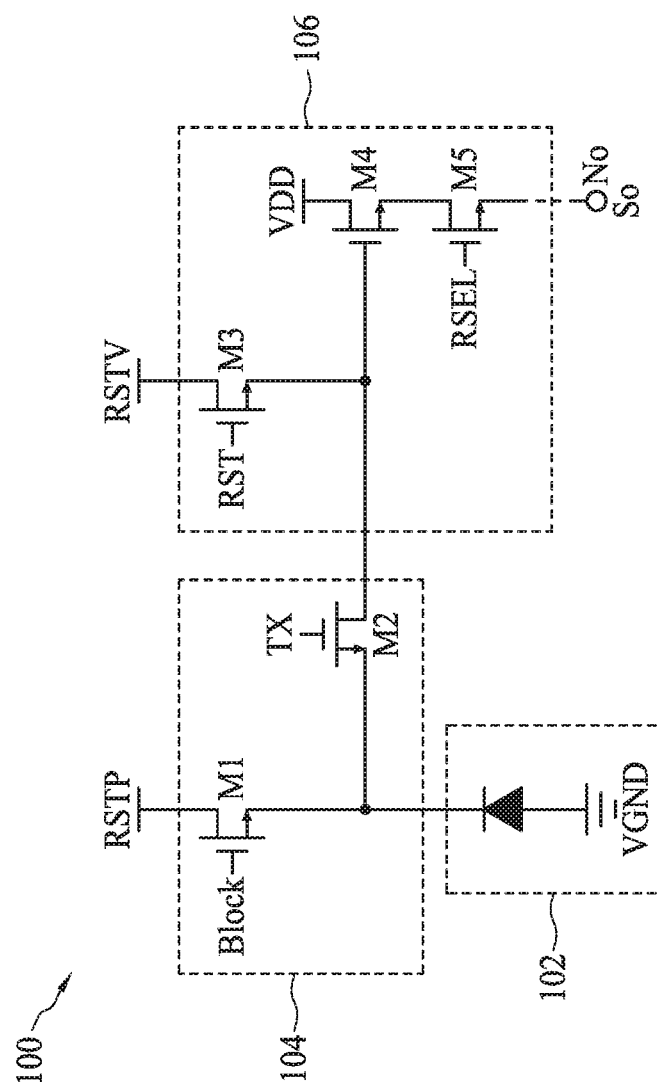
FIG. 1 is a schematic diagram illustrating a pixel circuit of an indirect-time-of-flight sensor accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "above," "upper", "lower", "left" "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic diagram illustrating a pixel circuit 100 of an indirect-time-of-flight (iToF) sensor accordance with some embodiments. The pixel circuit 100 may be an active pixel sensor (APS). The pixel circuit 100 comprises a photodiode 102, a control circuit 104, and an output circuit 106. The cathode of the photodiode 102 is coupled to the ground voltage VGND. The anode of the photodiode 102 is coupled to the control circuit 104. The photodiode 102 is capable of generating electrical current according to an incoming light signal. The incoming light signal may be a reflecting laser signal (or a reflecting light signal) of an emitting laser signal (or an emitting light signal). The control circuit 104 is coupled to the photodiode 102 for selectively coupling a cathode of the photodiode 102 to a reference voltage RSTP to generate the electrical current according to a control signal Block. More specifically, the control circuit 104 is arranged to control the operation modes of the photodiode 102 according to a first control signal and to selectively couple the photodiode 102 to the output circuit 106 according to a second control signal. The output circuit 106 is coupled to the control circuit 104 for integrating or accumulating the electrons generated by the photodiode 102 to generate an output signal So according to a select signal RSEL and a reset signal RST. The output signal So may be a current signal corresponding to the stored or accumulated electrons or electrical charges.

According to some embodiments, the control signal 104 comprises a first field-effect transistor (ITT) M1 and a second FET M2. The FETs M1 and M2 may be n-type metal-oxide-semiconductor field-effect transistor (MOSFET). An FET may comprise two connecting terminals (e.g. a drain and a source) and a control terminal (e.g. a gate). The gate of the PET M1 is coupled to the first control signal Block. The drain of the FET M1 is coupled to a first reference voltage RSTP, The source of the FET M1 is coupled to the cathode of the photodiode 102. The gate of the PET M2 is coupled to the second control signal TX. The source of the PET M2 is coupled to the cathode of the photodiode 102.

The output circuit 106 comprises a first FET M3, a second PET M4, and a third PET M5. The FETs M3, M4, and M5 may be n-type metal-oxide-semiconductor field-effect transistor (MOSFET). The gate of the PET M3 is coupled to the reset signal RST. The drain of the PET M3 is coupled to a second reference voltage RSTV. The source of the PET M3 is coupled to the drain of the FET M2. The gate of the PET M4 is coupled to the source of the PET M3. The drain of the FET M4 is coupled to a supply voltage VDD. The gate of the PET M5 is coupled to the select signal RSEL. The drain of the PET M5 is coupled to the source of the PET M4. The source of the FET M5 is arranged to output the output signal So. The first reference voltage RSTP is different from the second reference voltage RSTV. For example, the first reference voltage RSTP may be higher than the second reference voltage RSTV. According to some embodiment, the second reference voltage RSTV is selectively coupled to the connecting terminal (i.e. the drain of the PET M2 and the gate of the FET M4) between the control circuit 104 and the output circuit 106 according to the reset signal RST.

Figure 2C:
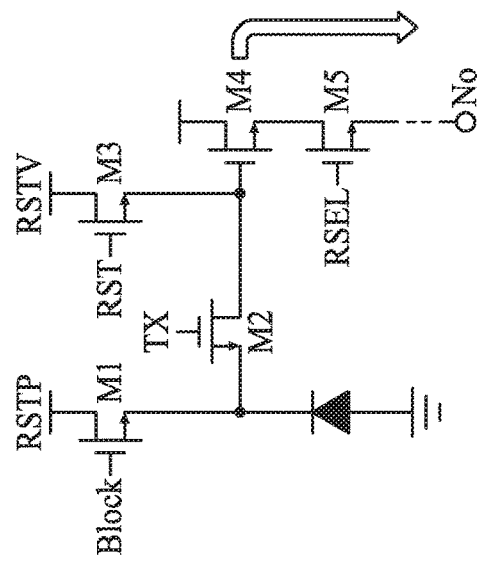
FIG. 2C is a diagram illustrating a third operation de of a pixel circuit in accordance with some embodiments.
Figure 2B:
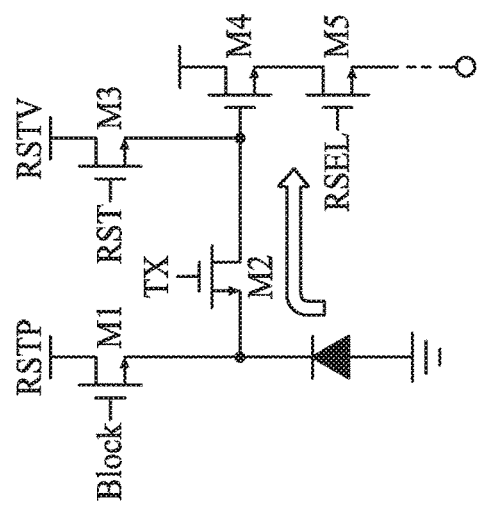
FIG. 2B is a diagram illustrating a second operation mode of a pixel circuit in accordance with some embodiments.
Figure 2A:
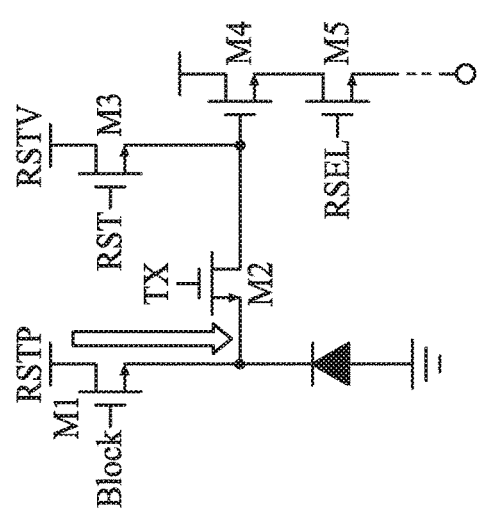
FIG. 2A is a diagram illustrating a first operation mode of a pixel circuit in accordance with some embodiments.

FIG. 2z\ is a diagram illustrating a first operation mode of the pixel circuit 100 in accordance with some embodiments. FIG. 2B is a diagram illustrating a second operation mode of the pixel circuit 100 in accordance with some embodiments. FIG. 2C is a diagram illustrating a third operation mode of the pixel circuit 100 in accordance with some embodiments. According to some embodiments, the first operation mode may be a pixel blocking mode, the second operation mode may be a pixel integrating mode, and the third operation mode may be a pixel outputting mode.

During the pixel blocking mode of the pixel circuit 100, the control signal Block is arranged to turn on (e.g. close) the FET M1 for connecting the cathode of the photodiode 102 to the reference voltage RSTP, and the control signal TX is arranged to turn off (e.g. open) the FET M2 for disconnecting the cathode of the photodiode 102 from the output circuit 106. For example, during the pixel blocking mode of the pixel circuit 100, the voltage level of the control signal Block is a relatively high voltage level (e.g. the supply voltage VDD), and the voltage level of the control signal TX is a relatively low voltage level (e.g. the ground voltage VGND). When the cathode of the photodiode 102 is connected to the reference voltage RSTP (e.g. the supply voltage VDD), the photodiode 102 may be reverse biased, and the photodiode 102 may operate under a photoconductive mode, Therefore, during the pixel blocking mode, the electrical current generated by the photodiode 102 is blocked from the output circuit 106.

During the pixel integrating mode of the pixel circuit 100, the control signal Block is arranged to turn off the FET M1 for disconnecting the cathode of the photodiode 102 from the reference voltage RSTP, and the control signal TX is arranged to turn on the FET M2 for connecting the cathode of the photodiode 102 to the output circuit 106, i.e. the gate of the FET M4. For example, during the pixel integrating mode of the pixel circuit 100, the voltage level of the control signal Block is a relatively low voltage level (e.g. the ground voltage VGND), and the voltage level of the control signal TX is a relatively high voltage level (e.g. the supply voltage VDD). When the cathode of the photodiode 102 is connected to the gate of the FET M4, the photodiode 102 may be zero biased, and the photodiode 102 may operate under a photovoltaic mode. Therefore, during the pixel integrating mode, the electrical current generated by the photodiode 102 is integrated or stored on the gate of the FET M4. It is noted that the FETs M3 and M5 are opened during the pixel integrating mode.

During the pixel outputting mode of the pixel circuit 100, the control signal TX is arranged to turn off the FET M2 for disconnecting the cathode of the photodiode 102 from the gate of the FET M4, Moreover, during the pixel outputting mode of the pixel circuit 100, the pixel circuit 100 is configured to perform a first correlated double sampling (CDS) operation for a first time interval (e.g. T1 in FIG. 4) and a second CDS operation for a second time interval (e.g. T2 in FIG. 4) to readout the electrical charges or integrated electrons on the gate of the FET M4, wherein the first time interval is longer than the second time interval. More specifically, during the first CDS operation, the reset signal RST is arranged to turn off (e.g. open) the FET M3 for disconnecting the reference voltage RSTV from the gate of the FET M4, and the select signal RSEL is arranged to turn on the FET M5 for connecting the FET M4 to the output terminal No to read a first current. Then, during the second CDS operation, the reset signal RST is arranged to turn on the FET M3 for connecting the reference voltage RSTV to the gate of the FET M4, and the select signal RSEL is arranged to turn on the FET M5 for connecting the FET M4 to the output terminal No to read a second current. According to some embodiments, the electrical charges on the gate of FET M4 may be obtained according to the first current and the second current. For example, the electrical charges on the gate of FET M4 may be proportional to the difference between the first current and the second current.

Figure 3:
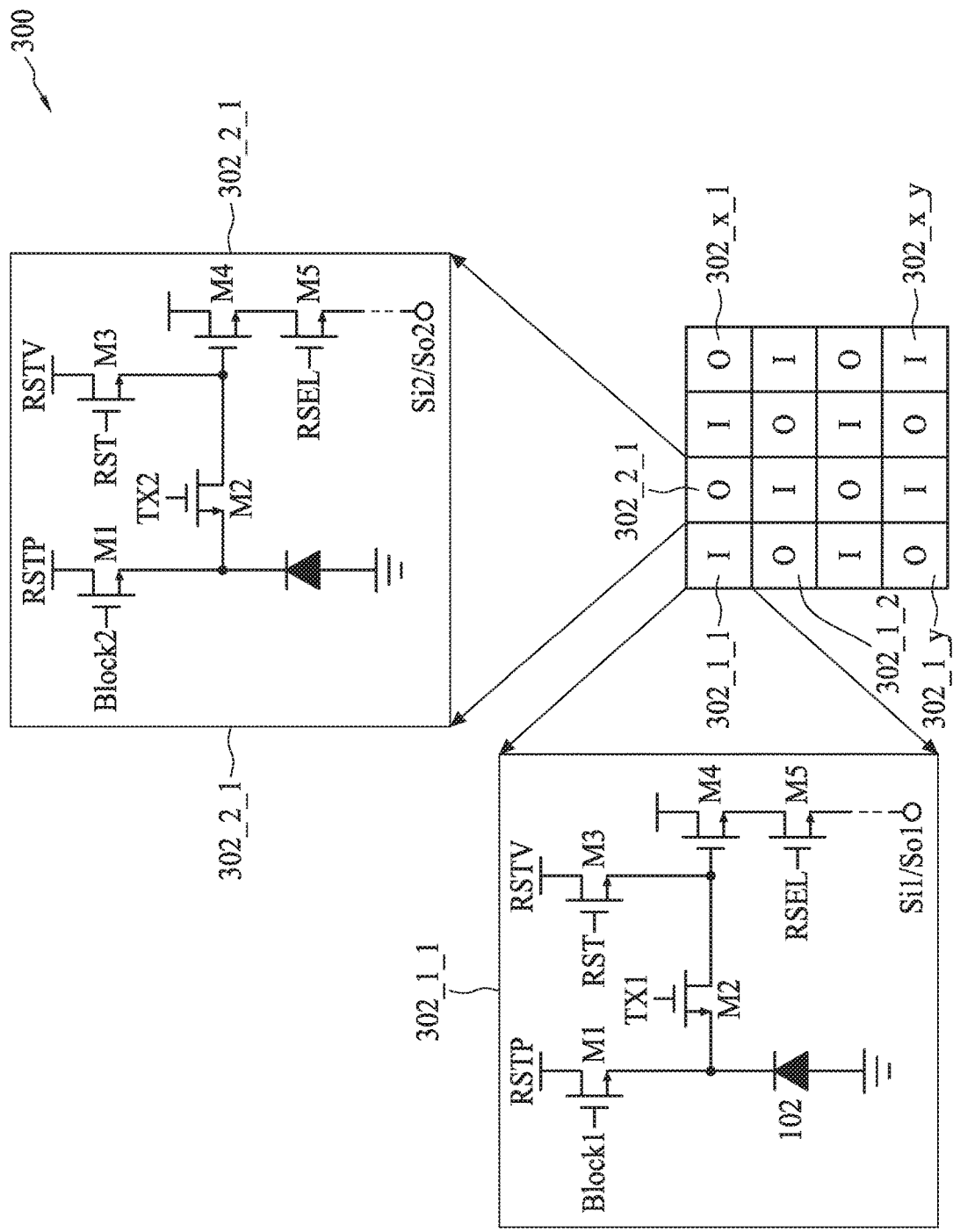
FIG. 3 is a diagram illustrating a pixel array in accordance with some embodiments.

FIG. 3 is a diagram illustrating a pixel array 300 in accordance with some embodiments. The pixel array 300 comprises a plurality of pixel circuits 302_1_1-302_x_y. The pixel circuits 302_1_1-302_x_y are arranged to be a two dimensional (2D) array having a plurality of pixel columns and a plurality pixel rows. According to some embodiments, the configuration of each pixel in the pixel array 300 may be similar to the above mentioned pixel circuit 100. Moreover, the pixel array 300 is arranged to be 2-Tap image sensor. During the operation of the pixel array 300, the controlling phases of the pixel circuits 302_1_1-302_x_y in the pixel array 300 may be divided into two phases, e.g. an in-phase stage (i.e. 0 degrees) and an out-of-phase stage (i.e. 180 degrees). In other words, the pixel circuits 302_1_1-302_x_y in the pixel array 300 may be divided into a plurality of in-phase pixel circuits (I) and a plurality of out-of-phase pixel circuits (O). The in-phase pixel circuits (I) are arranged to receive a reflecting laser signal of a laser signal during a first phase of the laser signal, and the first phase is in-phase with the laser signal. The out-of-phase pixel circuits (Q) are arranged to receive the reflecting laser signal of the laser signal during a second phase of the laser signal, and the second phase is 180 degrees out-of-phase to the laser signal.

As shown in FIG. 3, the in-phase pixel circuits and the out-of-phase pixel circuits are interlaced in each row and each column. For example, the pixel circuits 302_1_1 and 302_2_2 are in-phase pixel, and the pixel circuits 302_2_1 and 302_1_2 are out-of-phase pixel.

According to some embodiments, during the in-phase stage, a control circuit (not shown in FIG. 3) is arranged to turn on the FETs M2 and to turn off the FETs M1 of the in-phase pixel circuits for sampling or integrating the electrons generated by the photodiodes 102 of the in-phase pixel circuits. Moreover, during the in-phase stage, the control circuit is arranged to turn off the FETs M2 and to turn on the FETs M1 of the out-of-phase pixel circuits. During the out-of-phase stage, the control circuit is arranged to turn on the FETs M2 and to turn off the FETs M1 of the out-of-phase pixel circuits for sampling or integrating the electrons generated by the photodiodes 102 of the out-of-phase pixel circuits. Moreover, during the out-of-phase stage, the control circuit is arranged to turn off the FETs M2 and to turn on the FETs M1 of the in-phase pixel circuits.

Figure 4:
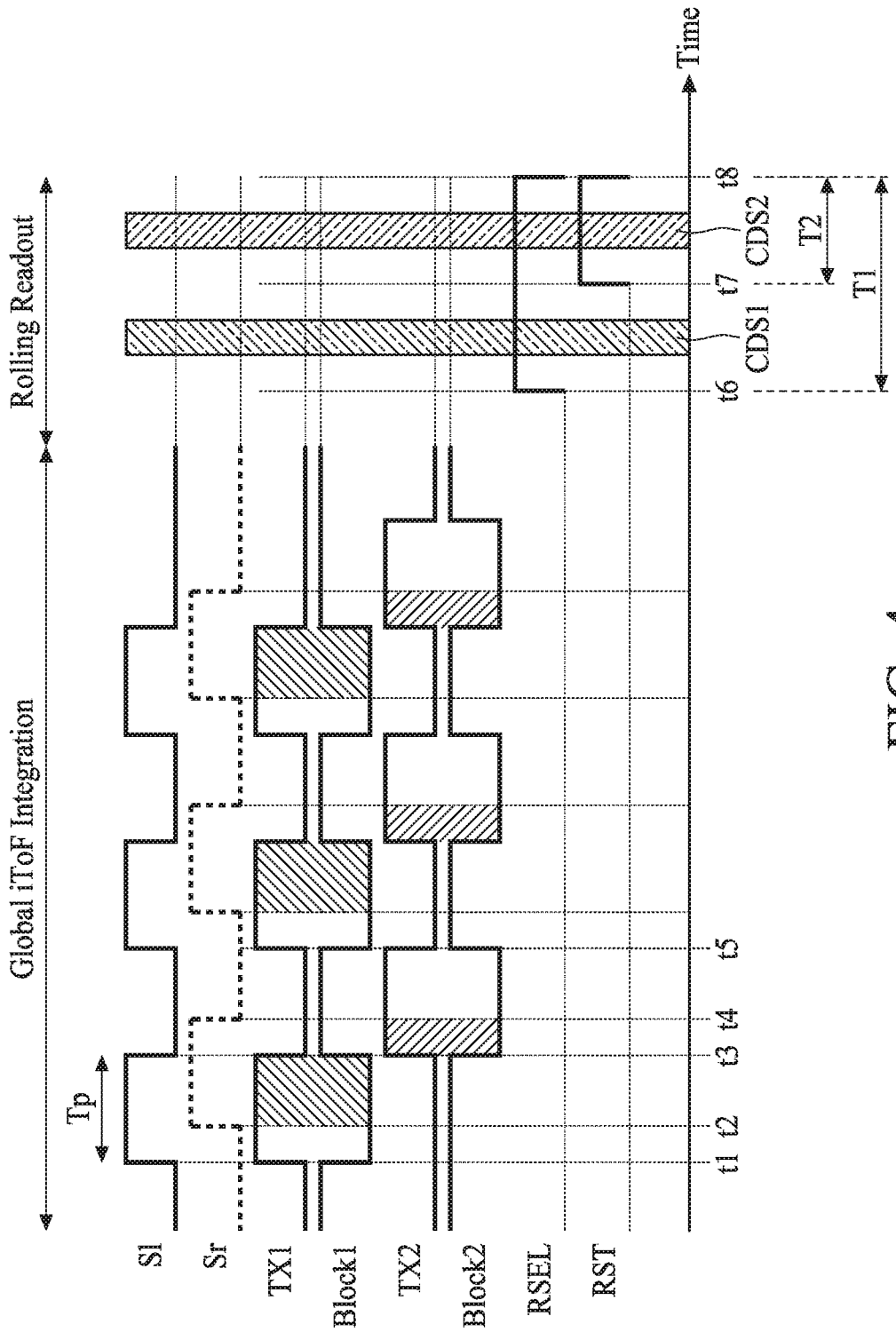
FIG. 4 is a timing diagram illustrating signal waveforms of a pixel accordance with some embodiments.

FIG. 4 is a timing diagram illustrating the signal waveforms of the pixel array 300 in accordance with some embodiments. For brevity, FIG. 4 merely shows the signal waveforms of the in-phase pixel circuit 302_1_1 and the out-of-phase pixel circuit 302_2_2 in the pixel array 300. The operations of the other in-phase pixel circuits and out-of-phase pixel circuits are similar to the operations of the in-phase pixel circuit 302_1_1 and the out-of-phase pixel circuit 302_2_2 respectively. Moreover, FIG. 4 shows the signal waveforms of a laser signal S1, a reflecting laser signal Sr, a first control signal TX1, a second control signal Block1, a third control signal TX2, a fourth control signal Block2, a select signal RSEL, and a reset signal RST. The first control signal TX1 and the second control signal Block1 are arranged to control the FETs M2 and M1 in the in-phase pixel circuit 302_1_1 respectively. The third control signal TX2 and the fourth control signal Block2 are arranged to control the FETs M2 and M1 in the out-of-phase pixel circuit 302_2_1 respectively. The select signal RSEL and the reset signal RST are arranged to control the FETs M5 and M3 in the in-phase pixel circuit 302_1_1 and the out-of-phase pixel circuit 302_2_1 respectively.

According to some embodiments, at time t1, a laser emitting device not shown in FIG. 3) is arranged to emit the laser signal S1 (i.e. the voltage level of the laser signal S1 transits to the high voltage level from the low voltage level). The laser signal S1 may be a periodic clock signal. Meanwhile, at time t1, the control circuit is arranged to generate the control signal TX1 to turn on the FET M2 of the in-phase pixel circuit 302_1_1 and to generate the control signal Block1 to turn off the FET M1 of the in-phase pixel circuit 302_1_1, When the FET M2 and the FET M1 of the in-phase pixel circuit 302_1_1 are turned on and turned off respectively, the in-phase pixel circuit 302_1_1 is ready to detect the reflecting laser signal Sr of the laser signal S1. At time t2, the photodiode 102 of the in-phase pixel circuit 302_1_1 detects the reflecting laser signal Sr and the photodiode 102 generates electrical current to the gate of the FET M4 of the in-phase pixel circuit 302_1_1.

At time t3, when the voltage level of the laser signal S1 transits to the low voltage level from the high voltage level, the control circuit is arranged to turn off and turn on the FET M2 and the FET M1 of the in-phase pixel circuit 302_1_1 respectively, and the electrons is stored on the gate of the FET M4 of the in-phase pixel circuit 302_1_1. Meanwhile, at time t3, the control circuit is arranged to generate the control signal TX2 to turn on the FET M2 of the out-of-phase pixel circuit 302_2_1 and to generate the control signal Block2 to turn off the FET M1 of the out-of-phase pixel circuit 302_2_1. When the FET M2 and the FET M1 of the out-of-phase pixel circuit 302_2_1 are turned on and turned off respectively, the out-of-phase pixel circuit 302_2_1 is ready to detect the reflecting laser signal Sr of the laser signal S1. Therefore, at time t3, the photodiode 102 of the out-of-phase pixel circuit 302_2_1 continues detecting the reflecting laser signal Sr to generate electrical current to the gate of the FET M4 of the out-of-phase pixel circuit 302_2_1. At time t4, the voltage level of the reflect laser signal Sr transits to the low voltage level from the high voltage level, the photodiode 102 of the out-of-phase pixel circuit 302_2_1 stop generating electrical current to the gate of the FET M4 of the out-of-phase pixel circuit 302_2_1. At time t5, when the voltage level of the laser signal S1 transits to the high voltage level from the low voltage level, the control circuit is arranged to turn off and turn on the FET M2 and the FET M1 of the out-of-phase pixel circuit 302_2_1 respectively, and the electrons is stored on the gate of the FET M4 of the out-of-phase pixel circuit 302_2_1.

According to some embodiments, the control circuit may repeat the above operation of the in-phase pixel circuit 302_1_1 and the out-of-phase pixel circuit 302_2_1 for a predetermined number of periods of the laser signal S1 (i.e. the global iToF integration process) such that the electrons may be integrated or stored on the gate of the FET M4 of the in-phase pixel circuit 302_1_1 and the gate of the FET M4 of the out-of-phase pixel circuit 302_2_1.

After the global iToF integration process, the control circuit is arranged to perform a rolling readout operation upon the in-phase pixel circuit 302_1_1 and the out-of-phase pixel circuit 302_2_1. The rolling readout operation may comprise the above mentioned first and second CDS operations. At time t6, the control circuit is arranged to perform the first CDS operation upon the in-phase pixel circuit 302_1_1 and the out-of-phase pixel circuit 302_2_1 for the first time interval T1. More specifically, the control circuit is arranged to generate the select signal RSEL and the reset signal RST to turn on the FET M5 and to turn off the FET M3 of the in-phase pixel circuit 302_1_1 and the out-of-phase pixel circuit 302_2_1 for generating a first in-phase output signal Si1 and a first out-of-phase output signal So1 according to the electrons on the gate of the FET M4 of the in-phase pixel circuit 302_1_1 and the gate of the FET M4 of the out-of-phase pixel circuit 302_2_1 respectively. According to some embodiments, the in-phase output signal Si1 and the out-of-phase output signal So1 may be current signals flowing through the FET M5 of the in-phase pixel circuit 302_1_1 and the FET M5 of the out-of-phase pixel circuit 302_2_1 respectively.

At time t2, the control circuit is arranged to perform the second CDS operation upon the n-phase pixel circuit 302_1_1 and the out-of-phase pixel circuit 302_2_1 for the second time interval T2. More specifically, the control circuit is arranged to generate the select signal RSEL, and the reset signal RST to turn on the FET M5 and the FET M3 of the in-phase pixel circuit 302_1_1 and the out-of-phase pixel circuit 302_2_1 for generating a second in-phase output signal Si2 and a second out-of-phase output signal So2 according to the electrons on the gate of the FET M4 of the in-phase pixel circuit 302_1_1 and the gate of the FET M4 of the out-of-phase pixel circuit 302_2_1 respectively.

After the rolling readout operation, at time t7, the control circuit is arranged to generate the select signal RSEL and the reset signal RST to turn off the PET M5 and the PET M3 of the in-phase pixel circuit 302_1_1 and the out-of-phase pixel circuit 302_2_1 respectively.

According to some embodiments, the electrical charges on the gate of the PET M4 of the in-phase pixel circuit 302_1_1 may be obtained by the first in-phase output signal Si1 and the second in-phase output signal Si2, and the electrical charges on the gate of the PET M4 of the out-of-phase pixel circuit 302_2_1 may be obtained by the first out-of-phase output signal So1 and the second out-of-phase output signal So2. For example, the electrical charges on the gate of the PET M4 of the in-phase pixel circuit 302_1_1 may be obtained by subtracting the first in-phase output signal Si1 from the second in-phase output signal Si2, and the electrical charges on the gate of the PET M4 of the out-of-phase pixel circuit 302_2_1 may be obtained by subtracting the first out-of-phase output signal So1 from the second out-of-phase output signal So2.

According to some embodiments, when the electrical charges on the gates of the FETs M4 of the pixel circuits 302_1_1-302_x_y are obtained, an interpolation operation may be performed upon the electrical charges to calculate the depths (or the distance corresponding to the time of flight, ToF) detected by the pixel circuits 302_1_1-302_x_y.

Figure 5B:
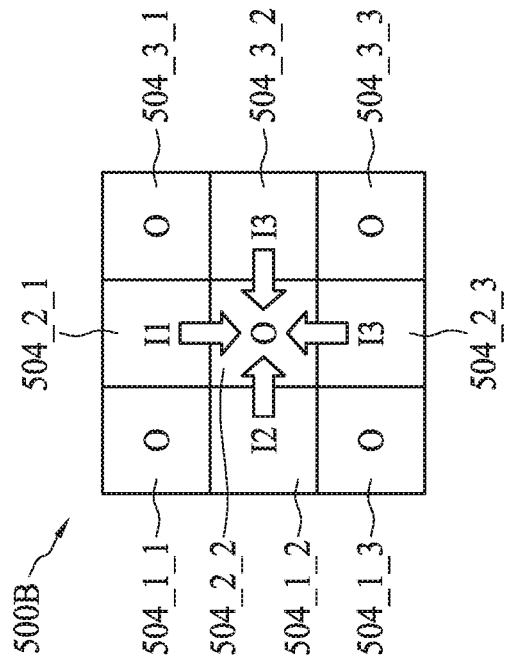
FIG. 5B is a diagram illustrating a portion of a pixel array arranged for calculating the depth detected by an out-of-phase pixel in accordance with some embodiments.
Figure 5A:
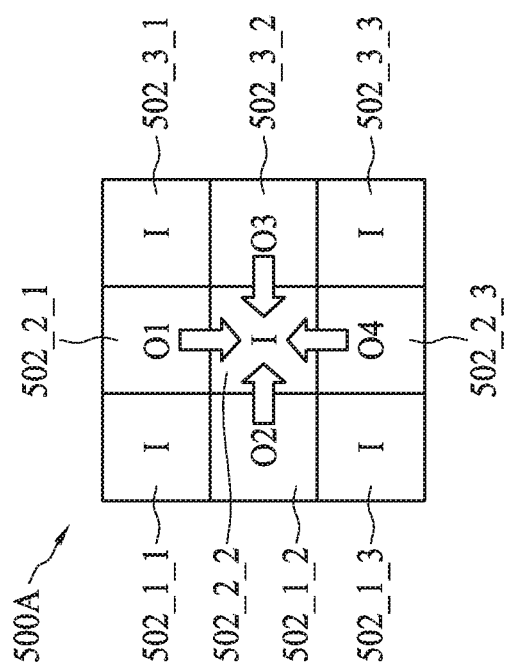
FIG. 5A is a diagram illustrating a portion of a pixel array arranged for calculating the depth detected by an in-phase pixel in accordance with some embodiments.

FIG. 5A is a diagram illustrating a portion 500A of the pixel array 300 arranged for calculating the depth detected by an in-phase pixel (e.g. 502_2_2) in accordance with some embodiments. The portion 500A comprises a plurality of in-phase pixel circuits 502_1_1, 502_3_1, 502_2_2, 502_1_3, and 502_3_3, and a plurality of out-of-phase pixel circuits 502_2_1, 502_1_2, 502_3_2, and 502_2_3. The in-phase pixel circuit 502_2_2 is surrounded by four out-of-phase pixel circuits (i.e. 502_2_1, 502_1_2, 502_3_2, and 502_2_3). More specifically, the out-of-phase pixel circuits 502_2_1 and 502_2_3 are disposed on the upper side and the lower side (i.e. the vertical direction) of the in-phase pixel circuit 502_2_2 respectively. The out-of-phase pixel circuits 502_1_2 and 502_3_2 are disposed on the left side and the right side (i.e. the horizontal direction) of the in-phase pixel circuit 502_2_2 respectively.

According to some embodiments, the depth detected by the in-phase pixel 502_2_2 is calculated by using the electrons integrated in the in-phase pixel 502_2_2 and the interpolation of the electrons integrated in the out-of-phase pixel circuits 502_2_1, 502_1_2, 502_3_2, and 502_2_3. The depth (i.e. Depth_odd) detected by the in-phase pixel 502_2_2 may be obtained by the following equation (1):

$$\text{Depth\_odd} = \frac{1}{2} * S * Tp * \left( \frac{O1 + O2 + O3 + O4}{4 * I + O1 + O2 + O3 + O4} \right) \quad (1)$$

The parameter S is the speed of light or laser signal. The parameter Tp is the pulse width of the laser signal S1. The parameter I is the electrical charges detected by the in-phase pixel 502_2_2. The parameters O1, O2, O3, and O4 are the electrical charges detected by the out-of-phase pixel circuits 502_2_1, 502_1_2, 502_3_2, and 502_2_3 respectively. Accordingly, the depth (i.e. Depth_odd) detected by the in-phase pixel 502_2_2 may be obtained by interpolating the four signals generated by the out-of-phase pixel circuits 50221, 502_1_2, 502_3_2, and 502_2_3 that disposed on the four directions of the in-phase pixel 502_2_2 respectively.

FIG. 5B is a diagram illustrating a portion 500B of the pixel array 300 arranged for calculating the depth detected by an out-of-phase pixel (e.g. 504_2_2) in accordance with some embodiments. The portion 500B comprises a plurality of out-of-phase pixel circuits 504_1_1, 504_3_1, 504_2_2, 504_1_3, and 504_3_3, and a plurality of in-phase pixel circuits 504_2_1, 504_1_2, 504_3_2, and 504_2_3. The out-of-phase pixel 504_2_2 is surrounded by four in-phase pixel circuits (i.e. 504_2_1, 504_1_2, 504_3_2, and 504_2_3). More specifically, the in-phase pixel circuits 504_2_1, 504_1_2, 504_3_2, and 504_2_3 are disposed on the upper side, the left side, the right side, and the lower side of the out-of-phase pixel circuit 502_4_2 respectively.

According to some embodiments, the depth detected by the out-of-phase pixel 504_2_2 is calculated by using the electrons integrated in the out-of-phase pixel 504_2_2 and the interpolation of the electrons integrated in the in-phase pixel circuits 504_2_1, 504_1_2, 504_3_2, and 504_2_3. The depth (i.e. Depth_even) detected by the out-of-phase pixel 504_2_2 may be obtained by the following equation (2):

$$\text{Depth\_even} = \frac{1}{2} * S * Tp * \left( \frac{4 * O}{I1 + I2 + I3 + I4 + 4 * O} \right) \quad (2)$$

The parameter S is the speed of light or laser signal. The parameter Tp is the pulse width of the laser signal S1. The parameter O is the electrical charges detected by the out-of-phase pixel 504_2_2. The parameters I1, I2, I3, and I4 are the electrical charges detected by the in-phase pixel circuits 504_2_1, 504_1_2, 504_3_2, and 504_2_3 respectively. Accordingly, the depth (i.e. Depth_even) detected by the out-of-phase pixel 504_2_2 may be obtained by interpolating the four signals generated by the in-phase pixel circuits 504_2_1, 504_1_2, 504_3_2, and 504_2_3 that disposed on the four directions of the out-of-phase pixel 504_2_2 respectively.

Figure 6:
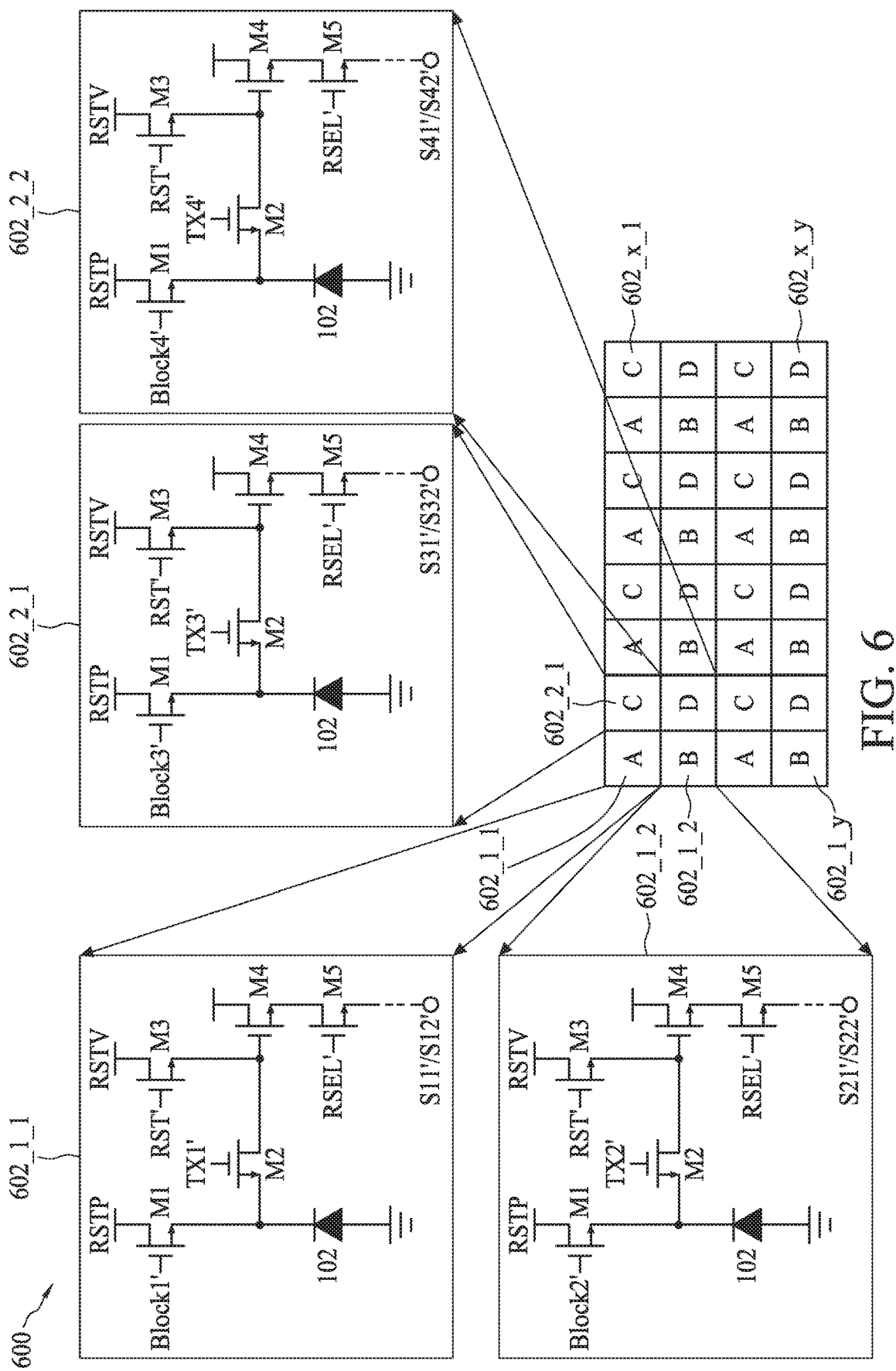
FIG. 6 is a diagram illustrating a pixel array in accordance with some embodiments.

FIG. 6 is a diagram illustrating a pixel array 600 in accordance with some embodiments. The pixel array 300 comprises a plurality of pixel circuits 602_1_1-602_x_y. The pixel circuits 602_1_1-602_x_y are arranged to be a two dimensional (2D) array having a plurality of pixel columns and a plurality pixel rows. According to some embodiments, the configuration of each pixel in the pixel array 600 may be similar to the above mentioned pixel circuit 100. Moreover, the pixel array 600 is arranged to be 4-Tap image sensor. During the operation of the pixel array 600, the controlling of the pixel circuits 602_1_1-602_x_y in the pixel array 600 may be divided into four phases, e.g. a first phase stage (i.e. 0 degrees), a second phase stage (i.e. 90 degrees), a third phase stage (i.e. 180 degrees), and a four phase stage (i.e. 270 degrees). In other words, the pixel circuits 602_1_1-602_x_y in the pixel array 600 may be divided into a plurality of first-phase pixel circuits (A), a plurality of second-phase pixel (B), a plurality of third-phase pixel (C), and a plurality of fourth-phase pixel circuits (D). As shown in FIG. 6, the first-phase pixel circuits and the third-phase pixel circuits are interlaced in the odd rows, the second-phase pixel circuits and the fourth-phase pixel circuits are interlaced in the even rows, the first-phase pixel circuits and the second-phase pixel circuits are interlaced in the odd columns, and the third-phase pixel circuits and the fourth-phase pixel circuits are interlaced in the even columns. For example, the pixel circuits 602_1_1, 602_2_1, 602_1_2, and 602_2_2 are the first-phase pixel, the second-phase pixel, the third-phase pixel, and the fourth-phase pixel respectively. According to some embodiments, by using the four phases, i.e. 0 degrees, 90 degrees, 180 degrees, and 270 degrees to detect the depth of a target, the effect of background light interference may be reduced. In other words, the pixel array 600 supports the background cancellation requirement.

During the first-phase stage, a control circuit (not shown in FIG. 6) is arranged to turn on the FETs M2 and to turn off the FETs M1 and M3 of the first-phase pixel circuits for sampling or integrating the electrons generated by the photodiodes 102 of the first-phase pixel circuits. During the first-phase stage, the control circuit is also arranged to turn off the FETs M2 and to turn on the FETs M1 of the third-phase pixel circuits.

During the second-phase stage, the control circuit is arranged to turn on the FETs M2 and to turn off the FETs M1 and M3 of the second-phase pixel circuits for sampling or integrating the electrons generated by the photodiodes 102 of the second-phase pixel circuits. During the second-phase stage, the control circuit is also arranged to turn off the FETs M2 and to turn on the FETs M1 of the fourth-phase pixel circuits.

During the third-phase stage, the control circuit is arranged to turn on the FETs M2 and to turn off the FETs M1 and M3 of the third-phase pixel circuits for sampling or integrating the electrons generated by the photodiodes 102 of the third-phase pixel circuits. During the third-phase stage, the control circuit is also arranged to turn off the FETs M2 and to turn on the FETs M1 of the first-phase pixel circuits.

During the fourth-phase stage, the control circuit arranged to turn on the FETs M2 and to turn off the FETs M1 and M3 of the fourth-phase pixel circuits for sampling or integrating the electrons generated by the photodiodes 102 of the fourth-phase pixel circuits. During the fourth-phase stage, the control circuit is also arranged to turn off the FETs M2 and to turn on the FET M1 of the second-phase pixel circuits.

Figure 7:
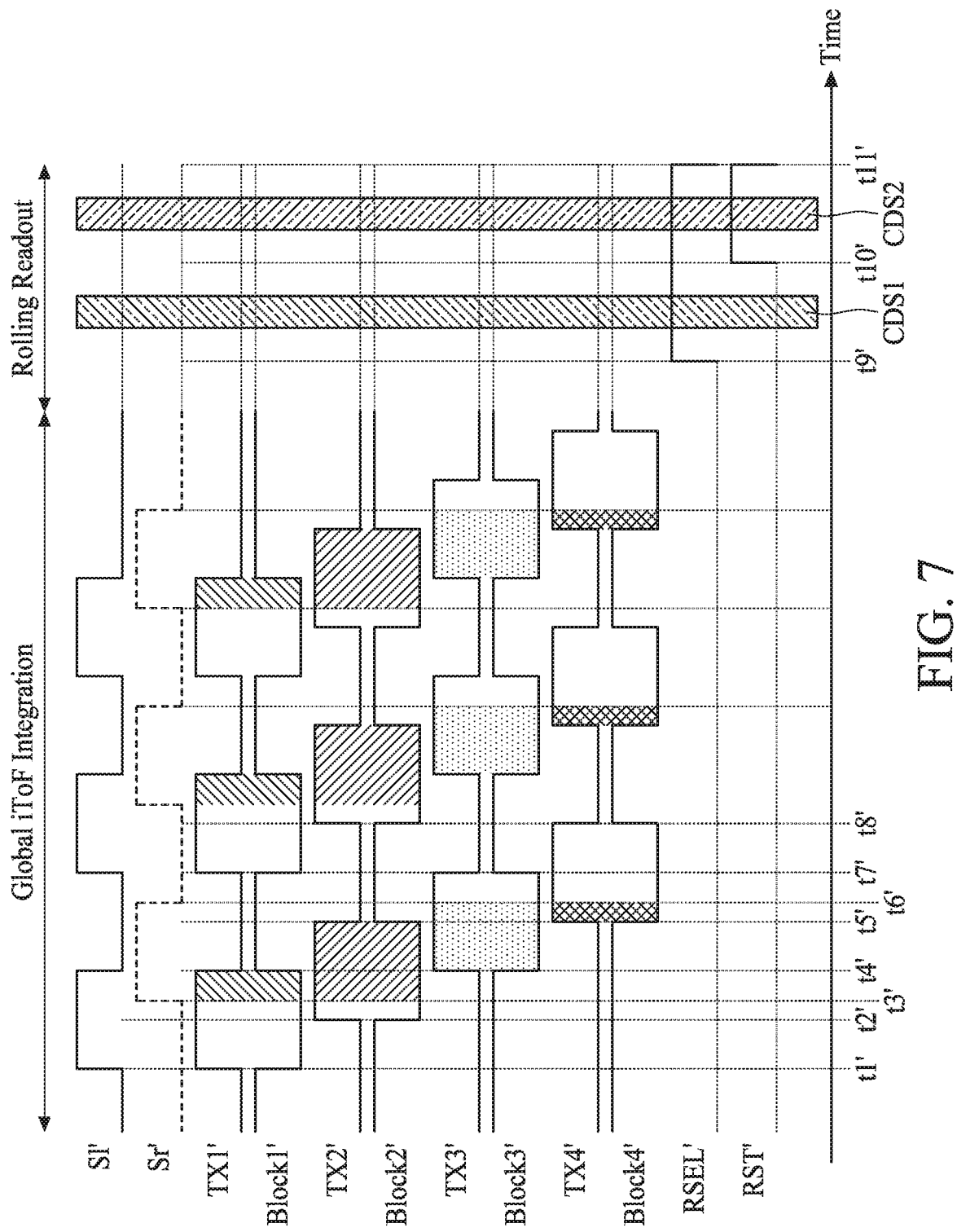
FIG. 7 is a tuning diagram illustrating signal waveforms of a pixel array in accordance with some embodiments.

FIG. 7 is a timing diagram illustrating the signal waveforms of the pixel array 600 in accordance with some embodiments. For brevity, FIG. 7 merely shows the signal waveforms of the first-phase pixel circuit 602_1_1, the second-phase pixel circuit 602_1_2, the third-phase pixel circuit 602_2_1, and the fourth-phase pixel circuit 602_2_2 in the pixel array 600. The operations of the first-phase pixel circuits, the second-phase pixel circuits, the third-phase pixel circuits, and the fourth-phase pixel circuits are similar to the operations of the first-phase pixel circuit 602_1_1, the second-phase pixel circuit 602_1_2, the third-phase pixel circuit 602_2_1, and the fourth-phase pixel circuit 602_2_2 respectively. Moreover, FIG. 7 shows the signal waveforms of a laser signal S1', a reflecting laser signal Sr', a first control signal TX1' a second control signal Block1', a third control signal TX2', a fourth control signal Block2', a fifth control signal TX3', a sixth control signal Block3', a sixth control signal TX4', a seventh control signal Block4' a select signal RSEL', and a reset signal RST'. The control signals TX1' and Block1' are arranged to control the FETs M2 and M1 in the first-phase pixel circuit 602_1_1 respectively. The control signals TX2' and Block2' are arranged to control the FETs M2 and M1 in the second-phase pixel circuit 602_1_2 respectively. The control signals TX3' and Block3' are arranged to control the FETs M2 and M1 in the third-phase pixel circuit 602_2_1 respectively. The control signals TX4' and Block4' are arranged to control the FETs M2 and M1 in the fourth-phase pixel circuit 602_2_2 respectively.

According to some embodiments, at time t1', a laser emitting device (not shown in FIG. 6) is arranged to emit the laser signal S1' (i.e. the voltage level of the laser signal S1' transits to the high voltage level from the low voltage level). The laser signal S may be a periodic clock signal. Meanwhile, at time t1', the control circuit is arranged to generate the control signal TX1' to turn on the FET M2 of the first-phase pixel circuit 602_1_1 and to generate the control signal Block1' to turn off the FET Nil of the first-phase pixel circuit 602_1_1, When the FET M2 and the FET M1 of the in-phase pixel circuit 602_1_1 are turned on and turned off respectively, the in-phase pixel circuit 602_1_1 is ready to detect the reflecting laser signal Sr' of the laser signal S1'.

At time t2', the control circuit is arranged to generate the control signal TX2' to turn on the FET M2 of the second-phase pixel circuit 602_1_2 and to generate the control signal Block2' to turn off the FET M1 of the second-phase pixel circuit 602_1_2. When the FET M2 and the FET M1 of the second-phase pixel circuit 602_1_2 are turned on and turned off respectively, the second-phase pixel circuit 602_1_2 is ready to detect the reflecting laser signal Sr' of the laser signal S1'.

At time t3', the photodiodes 102 of the first-phase pixel circuit 602_1_1 and the second-phase pixel circuit 602_1_2 detect the reflecting laser signal Sr', and the photodiodes 102 of the first-phase pixel circuit 602_1_1 and the second-phase pixel circuit 602_1_2 generate electrical current to the gate of the FETs M4 of the first-phase pixel circuit 602_1_1 and the second-phase pixel circuit 602_1_2 respectively.

At time t4', when the voltage level of the laser signal SU transits to the low voltage level from the high voltage level, the control circuit is arranged to turn off and turn on the FET M2 and the FET M1 of the first-phase pixel circuit 602_1_1 respectively, and the electrons is stored on the gate of the FET M4 of the first-phase pixel circuit 602_1_1. Meanwhile, at time t4', the control circuit is arranged to generate the control signal TX3' to turn on the FET M2 of the third-phase pixel circuit 602_2_1 and to generate the control signal Block3' to turn off the FET M1 of the third-phase pixel circuit 602_2_1. When the FET M2 and the FET M1 of the third-phase pixel circuit 602_2_1 are turned on and turned off respectively, the third-phase pixel circuit 602_2_1 is ready to detect the reflecting laser signal Sr' of the laser signal SF. Therefore, at time t4', the photodiode 102 of the third-phase pixel circuit 602_2_1 continues detecting the reflecting laser signal Sr' to generate electrical current to the gate of the FET M4 of the third-phase pixel circuit 602_2_1.

At time t5', the control circuit is arranged to turn off and turn on the FET M2 and the FET M1 of the second-phase pixel circuit 602_1_2 respectively, and the electrons is stored on the gate of the FET M4 of the second-phase pixel circuit 602_1_2. Meanwhile, at time t5', the control circuit is arranged to generate the control signal TX4' to turn on the FET M2 of the fourth-phase pixel circuit 602_2_2 and to generate the control signal Block4' to turn off the FET M1 of the fourth-phase pixel circuit 602_2_2. When the FET M2 and the FET M1 of the fourth-phase pixel circuit 602_2_2 are turned on and turned off respectively, the fourth-phase pixel circuit 602_2_2 is ready to detect the reflecting laser signal Sr' of the laser signal S1'. Therefore, at time t5', the photodiode 102 of the fourth-phase pixel circuit 602_2_2 continues detecting the reflecting laser signal Sr' to generate electrical current to the gate of the FET M4 of the fourth-phase pixel circuit 602_2_2.

At time t6', the voltage level of the reflect laser signal Sr' transits to the low voltage level from the high voltage level, the photodiodes 102 of the third-phase pixel circuit 60221 and the fourth-phase pixel circuit 602_2_2 stop generating electrical current to the gate of the FETs M4 of the third-phase pixel circuit 602_2_1 and the fourth-phase pixel circuit 602_2_2 respectively. At time t7', when the voltage level of the laser signal S1' transits to the high voltage level from the low voltage level, the control circuit is arranged to turn off and turn on the FET M2 and the FET M1 of the third-phase pixel circuit 602_2_1 respectively, and the electrons is stored on the gate of the FET M4 of the third-phase pixel circuit 602_2_1.

At time t8', the control circuit is arranged to turn off and turn on the FET M2 and the FET M1 of the fourth-phase pixel circuit 602_2_2 respectively, and the electrons is stored on the gate of the FET M4 of the fourth-phase pixel circuit 602_2_2.

According to some embodiments, the control circuit may repeat the above operation of the first-phase pixel circuit 602_1_1, the second-phase 602_1_2, the third-phase 602_2_1, and the fourth-phase pixel circuit 602_2_2 for a predetermined number of periods of the laser signal S1' (i.e. the global iToF integration process) such that the electrons may be integrated or stored on the gates of the FETs M4 of the first-phase pixel circuit 602_1_1, the second-phase 602_1_2, the third-phase 602_2_1, and the fourth-phase pixel circuit 602_2_2.

After the global iToF integration process, the control circuit is arranged to perform a rolling readout operation upon the first-phase pixel circuit 602_1_1, the second-phase 602_1_2, the third-phase 602_2_1, and the fourth-phase pixel circuit 602_2_2. The rolling readout operation may comprise the above mentioned first and second CDS operations. At time t9', the control circuit is arranged to perform the first CDS operation upon the first-phase pixel circuit 602_1_1, the second-phase 602_1_2, the third-phase 602_2_1, and the fourth-phase pixel circuit 602_2_2 to generate the first output signal S11, the second output signal S21', the third output signal S31', and the fourth output signal S41' respectively. At time t10', the control circuit is arranged to perform the second CDS operation upon the first-phase pixel circuit 602_1_1, the second-phase 602_1_2, the third-phase 602_2_1, and the fourth-phase pixel circuit 602_2_2 to generate the fifth output signal S12', the sixth output signal S22', the seventh output signal S32', and the eighth output signal S42' respectively. The rolling readout operation in FIG. 7 is similar to the rolling readout operation of FIG. 3. Thus, the detailed description is omitted here for brevity.

After the rolling readout operation, at time t11', the control circuit is arranged to generate the select signal RSEL and the reset signal RST to turn off the FET M5 and the FET M3 of the first-phase pixel circuit 602_1_1, the second-phase pixel circuit 602_1_2, the third-phase pixel circuit 602_2_1, and the fourth-phase pixel circuit 602_2_2 respectively.

Similar to the rolling readout operation of FIG. 3, the electrical charges on the gate of the FET M4 of the first-phase pixel circuit 602_1_1 may be obtained by subtracting the first output signal S11' from the fifth output signal S12'. The electrical charges on the gate of the FET M4 of the second-phase pixel circuit 602_1_2 may be obtained by subtracting the second output signal S21' from the sixth output signal S22". The electrical charges on the gate of the FET M4 of the third-phase pixel circuit 602_2_1 may be obtained by subtracting the third output signal S31' from the seventh output signal S32'. The electrical charges on the gate of the FET M4 of the fourth-phase pixel circuit 602_2_2 may be obtained by subtracting the fourth output signal S41' from the eighth output signal S42'.

According to some embodiments, when the electrical charges on the gates of the FETs M4 of the pixel circuits 602_1_1-602_x_y are obtained, an interpolation operation may be performed upon the electrical charges to calculate the depths (or the distance corresponding to the time of flight, ToF) detected by the pixel circuits 602_1_1-602_x_y. FIG. 8A is a diagram illustrating a portion 800A of the pixel array 600 arranged for calculating the depth detected by a first-phase pixel (e.g. 802_2_2) in accordance with some embodiments. The portion 800A comprises a first-phase pixel circuit 802_2_2, a plurality of second-phase pixel circuits 802_2_1 and 802_2_3, a plurality of third-phase pixel circuits 802_1_2 and 802_3_2, and a plurality of fourth-phase pixel circuits 802_1_1, 802_3_1, 802_1_3, and 802_3_3. The first-phase pixel circuit 802_2_2 is surrounded by the second-phase pixel circuits 802_2_1 and 802_2_3, the third-phase pixel circuits 802_1_2 and 802_3_2, and the fourth-phase pixel circuits 802_1_1, 802_3_1, 802_1_3, and 802_3_3. More specifically, the pixel circuits 802_2_1, 802_1_2, 802_3_2, and 802_2_3 are disposed on the upper side, the left side, the right side, and the lower side of the pixel circuit 802_2_2 respectively. The pixel circuit 802_1_1 and the pixel circuit 802_3_3 are disposed on a first diagonal of the pixel circuit 802_2_2. The pixel circuit 802_3_1 and the pixel circuit 802_1_3 are disposed on a second diagonal of the pixel circuit 802_2_2.

More specifically, the pixel circuit 802_1_1 is disposed on the upper-left vertex of the pixel circuit 802_2_2, the pixel circuit 802_3_3 is disposed on the lower-right vertex of the pixel circuit 802_2_2. The pixel circuit 802_3_1 is disposed on the upper-right vertex of the pixel circuit 802_2_2, the pixel circuit 802_1_3 is disposed on the lower-left vertex of the pixel circuit 802_2_2.

According to some embodiments, the depth detected by the first-phase pixel circuit 802_2_2 is calculated by using the electrons integrated in the first-phase pixel circuit 802_2_2 and the interpolation of the electrons integrated in the second-phase pixel circuits 802_2_1 and 802_2_3, the third-phase pixel circuits 802_1_2 and 802_3_2, and the fourth-phase pixel circuits 802_1_1, 802_3_1, 802_1_3, and 802_3_3. The depth (i.e. Depth_A) detected by the first-phase pixel circuit 802_2_2 may be obtained by the following equation (3):

$$\text{Depth\_A} = \frac{1}{2} * S * T_p * \frac{1}{2\pi} * \tan^{-1}\left(\frac{(D_1 + D_2 + D_3 + D_4) - 2(B_1 + B_2)}{2(C_1 + C_2) - 4(A)}\right) \quad (3)$$

The parameter S is the speed of light or laser signal. The parameter Tp is the pulse width of the laser signal S1'. The parameter A is the electrical charges detected by the first-phase pixel circuit 802_2_2. The parameters B1 and B2 are the electrical charges detected by the second-phase pixel circuits 80221 and 802_2_3 respectively. The parameters C1 and C2 are the electrical charges detected by the third-phase pixel circuits 802_1_2 and 802_3_2 respectively. The parameters D1, D2, D3, and D4 are the electrical charges detected by the fourth-phase pixel circuits 802_1_1, 802_3_1, 802_1_3, and 802_3_3 respectively. Accordingly, the depth (i.e. Depth_A) detected by the first-phase pixel circuit 802_2_2 may be obtained by interpolating the eight signals generated by the second-phase pixel circuits 802_2_1 and 802_2_3, the third-phase pixel circuits 802_1_2 and 802_3_2, and the fourth-phase pixel circuits 802_1_1, 802_3_1, 802_1_3, and 802_3_3 that disposed on the eight directions of the first-phase pixel circuit 802_2_2 respectively.

FIG. 8B is a diagram illustrating a portion 800B of the pixel array 600 arranged for calculating the depth detected by a second-phase pixel (e.g. 804_2_2) in accordance with some embodiments. The portion 800B comprises a second-phase pixel circuit 804_2_2, a plurality of first-phase pixel circuits 804_2_1 and 804_2_3, a plurality of fourth-phase pixel circuits 804_1_2 and 804_3_2, and a plurality of third-phase pixel circuits 804_1_1, 804_3_1, 804_1_3, and 804_3_3. The second-phase pixel circuit 802_2_2 is surrounded by the first-phase pixel circuits 804_2_1 and 804_2_3, the fourth-phase pixel circuits 804_1_2 and 804_3_2, and the third-phase pixel circuits 804_1_1, 804_3_1, 804_1_3, and 804_3_3. The detailed structure of the portion 800B is omitted here for brevity.

According to some embodiments, the depth detected by the second-phase pixel circuit 804_2_2 is calculated by using the electrons integrated in the second-phase pixel circuit 804_2_2 and the interpolation of the electrons integrated in the first-phase pixel circuits 804_2_1 and 804_2_3, the fourth-phase pixel circuits 804_1_2 and 804_3_2, and the third-phase pixel circuits 804_1_1, 804_3_1, 804_1_3, and 804_3_3. The depth (i.e. Depth_B) detected by the second-phase pixel circuit 804_2_2 may be obtained by the following equation (4):

$$\text{Depth\_B} = \frac{1}{2} * S * T_p * \frac{1}{2\pi} * \tan^{-1}\left(\frac{2(D_1 + D_2) - 4(B)}{(C_1 + C_2 + C_3 + C_4) - 2(A_1 + A_2)}\right) \quad (4)$$

The parameter B is the electrical charges detected by the second-phase pixel circuit 804_2_2. The parameters A1 and A2 are the electrical charges detected by the first-phase pixel circuits 804_2_1 and 804_2_3 respectively. The parameters D1 and D2 are the electrical charges detected by the fourth-phase pixel circuits 804_1_2 and 804_3_2 respectively. The parameters C1, C2, C3, and C4 are the electrical charges detected by the third-phase pixel circuits 804_1_1, 804_3_1, 804_1_3, and 804_3_3 respectively. Accordingly, the depth (i.e. Depth_B) detected by the second-phase pixel circuit 804_2_2 may be obtained by interpolating the eight signals generated by the first-phase pixel circuits 804_2_1 and 804_2_3, the fourth-phase pixel circuits 804_1_2 and 804_3_2, and the third-phase pixel circuits 804_1_1, 804_3_1, 804_1_3, and 804_3_3 that disposed on the eight directions of the second-phase pixel circuit 804_2_2 respectively.

FIG. 8C is a diagram illustrating a portion 800C of the pixel array 600 arranged for calculating the depth detected by a third-phase pixel (e.g. 806_2_2) in accordance with some embodiments. The portion 800C comprises a third-phase pixel circuit 806_2_2, a plurality of fourth-phase pixel circuits 806_2_1 and 806_2_3, a plurality of first-phase pixel circuits 806_1_2 and 806_3_2, and a plurality of second-phase pixel circuits 806_1_1, 806_3_1, 806_1_3, and 806_3_3. The third-phase pixel circuit 806_2_2 is surrounded by the fourth-phase pixel circuits 806_2_1 and 806_2_3, the first-phase pixel circuits 806_1_2 and 806_3_2, and the second-phase pixel circuits 806_1_1, 806_3_1, 806_1_3, and 806_3_3. The detailed structure of the portion 800C is omitted here for brevity.

According to some embodiments, the depth detected by the third-phase pixel circuit 806_2_2 is calculated by using the electrons integrated in the third-phase pixel circuit 806_2_2 and the interpolation of the electrons integrated in the fourth-phase pixel circuits 806_2_1 and 806_2_3, the first-phase pixel circuits 806_1_2 and 806_3_2, and the second-phase pixel circuits 806_1_1, 806_3_1, 806_1_3, and 806_3_3. The depth (i.e. Depth_C) detected by the third-phase pixel circuit 806_2_2 may be obtained by the following equation (5):

$$\text{Depth\_C} = \frac{1}{2} * S * T_p * \frac{1}{2\pi} * \tan^{-1}\left(\frac{2(D_1 + D_2) - (B_1 + B_2 + B_3 + B_4)}{4(C) - 2(A_1 + A_2)}\right) \quad (5)$$

The parameter C is the electrical charges detected by the third-phase pixel circuit 806_2_2. The parameters D1 and D2 are the electrical charges detected by the fourth-phase pixel circuits 806_2_1 and 806_2_3 respectively. The parameters A1 and A2 are the electrical charges detected by the first-phase pixel circuits 806_1_2 and 806_3_2 respectively. The parameters B1, B2, B3, and B4 are the electrical charges detected by the second-phase pixel circuits 806_1_1, 806_3_1, 806_1_3, and 806_3_3 respectively. Accordingly, the depth (i.e. Depth_C) detected by the third-phase pixel circuit 806_2_2 may be obtained by interpolating the eight signals generated by the fourth-phase pixel circuits 806_2_1 and 806_2_3, the first-phase pixel circuits 806_1_2 and 806_3_2, and the second-phase pixel circuits

806_1_1, 806_3_1, 806_1_3, and 806_3_3 that disposed on the eight directions of the third-phase pixel circuit 806_2_2 respectively.

FIG. 8D is a diagram illustrating a portion 800D of the pixel array 600 arranged for calculating the depth detected by a fourth-phase pixel (e.g. 808_2_2) in accordance with some embodiments. The portion 800D comprises a fourth-phase pixel circuit 808_2_2, a plurality of third-phase pixel circuits 808_2_1 and 808_2_3, a plurality of second-phase pixel circuits 808_1_2 and 808_3_2, and a plurality of first-phase pixel circuits 808_1_1, 808_3_1, 808_1_3, and 808_3_3. The fourth-phase pixel circuit 808_2_2 is surrounded by the third-phase pixel circuits 808_2_1 and 808_2_3, the second-phase pixel circuits 808_1_2 and 808_3_2, and the first-phase pixel circuits 808_1_1, 808_3_1, 808_1_3, and 808_3_3. The detailed structure of the portion 800D is omitted here for brevity.

According to some embodiments, the depth detected by the fourth-phase pixel circuit 808_2_2 is calculated by using the electrons integrated in the fourth-phase pixel circuit 808_2_2 and the interpolation of the electrons in the third-phase pixel circuits 808_2_1 and 808_2_3, the second-phase pixel circuits 808_1_2 and 808_3_2, and the first-phase pixel circuits 808_1_1, 808_3_1, 808_1_3, and 808_3_3. The depth (i.e. Depth detected by the fourth-phase pixel circuit 808_2_2 may be obtained by the following equation (6):

$$\text{Depth\_B} = \frac{1}{2} * S * T_p * \frac{1}{2\pi} * \tan^{-1}\left(\frac{4(D) - 2(B_1 + B_2)}{2(C_1 + C_2) - (A_1 + A_2 + A_3 + A_4)}\right) \quad (6)$$

The parameter D is the electrical charges detected by the fourth-phase pixel circuit 808_2_2. The parameters C1 and C2 are the electrical charges detected by the third-phase pixel circuits 808_2_1 and 808_2_3 respectively. The parameters B1 and B2 are the electrical charges detected by the second-phase pixel circuits 808_1_2 and 808_3_2 respectively. The parameters A1, A2, A3, and A4 are the electrical charges detected by the first-phase pixel circuits 808_1_1, 808_3_1, 808_1_3, and 808_3_3 respectively. Accordingly, the depth (i.e. Depth_D) detected by the fourth-phase pixel circuit 808_2_2 may be obtained by interpolating the eight signals generated by the third-phase pixel circuits 808_2_1 and 808_2_3, the second-phase pixel circuits 808_1_2 and 808_3_2, and the first-phase pixel circuits 808_1_1, 808_3_1, 808_1_3, and 808_3_3 that disposed on the eight directions of the fourth-phase pixel circuit 808_2_2 respectively.

According to some embodiments, the pixel array 300 and the pixel array 600 may be arranged to perform a global shutter operation. During the global shutter operation, the pixel circuits in the pixel array 300 as well as the pixel circuits in the pixel array 600 are arranged to be exposed simultaneously for a predetermined exposure time. More specifically, before the exposure begins, all pixel circuits in the pixel array 300 or 600 may be held in a 'keep clean state' to bleed off the excessive electrons to the supply voltage (e.g. RSTP). At the start of the exposure, each pixel simultaneously begins to collect electrons for the duration of the exposure time. At the end of exposure, each pixel transfers the collected electrons simultaneously to the corresponding readout terminal (e.g. No).

Figures 9A, 9B:
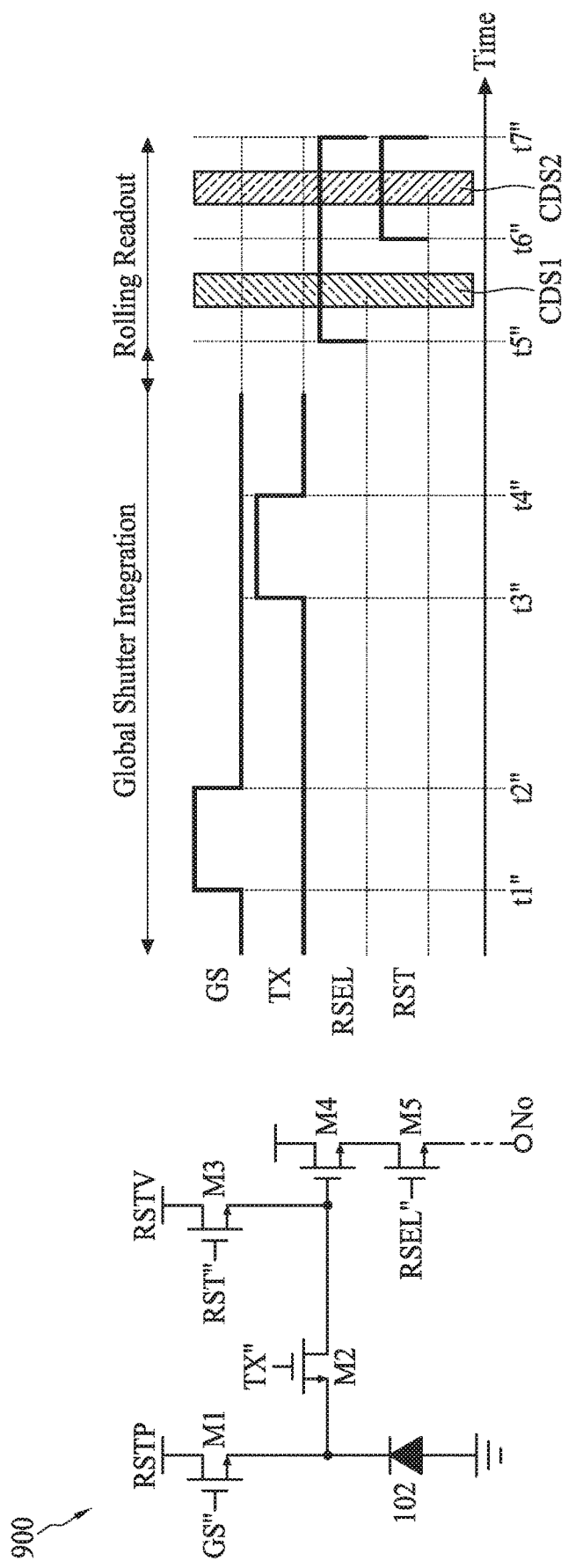
FIG. 9A is a diagram illustrating a pixel circuit n a pixel array during a global shutter operation in accordance with some embodiments.
FIG. 9B is a timing diagram illustrating a global shutter signal, a global control signal, a global reset signal, and a global select signal of a pixel array in accordance with some embodiments.

FIG. 9A is a diagram illustrating a pixel circuit 900 in the pixel array 300 as well as 600 during the global shutter operation in accordance with some embodiments. The pixel array 300 (or 600) is capable of generating a 2D (Two dimensional) image during the global shutter operation. The structure of the pixel circuit 900 is similar to the above mentioned pixel circuit 100. Thus, the detailed description of the pixel circuit 900 is omitted here for brevity. During the global shutter operation, the configuration of each pixel in the pixel array 300 is similar to the configuration of the pixel circuit 900. According to some embodiments, during the global shutter operation, the gates of the FETs M1 of the pixel array 300 are controlled by a global shutter signal GS". The gates of the FETs M2 of the pixel array 300 are controlled by a global control signal TX". The gates of the FETs M3 of the pixel array 300 are controlled by a global reset signal RST". The gates of the FETs M5 of the pixel array 300 are controlled by a global select signal RSEL".

FIG. 9B is a timing diagram illustrating the global shutter signal GS", the global control signal TX", the global reset signal RST", and the global select signal RSEL" of the pixel array 300 (or 600) in accordance with some embodiments. According to some embodiments, the global shutter operation is divided into two stages, i.e. the global shutter integration operation and the rolling readout operation. During the global shutter integration operation, the control circuit is arranged to generate the global shutter signal GS" to turn on the FETs M1 of the pixel array 300 in the time interval from time t1" to time t2". During the time interval from tune t1" to tune t2", the cathode of the photodiodes 102 in the pixel array 300 are coupled to the reference voltage RSTP for cleaning the excessive electrons of the photodiodes 102. During the time interval from time t2" to time t3" the photodiodes 102 is exposed for the predetermined exposure time. During the time interval from time t3" to time t4", the global control signal TX" turns on the FETs M2 of the pixel array 300 to integrate the electrons on the gates of the FETs M4 respectively.

During the rolling readout operation, the control circuit may perform the above mentioned first and second CDS operations upon the pixel circuits in the pixel array 300. More specifically, at time t5" (i.e. the first CDS operation), the control circuit is arranged to generate the global select signal RSEL" and the global reset signal RST" to turn on the FETs M5 and to turn off the FETs M3 of the pixel circuits in the pixel array 300. At time t7 (i.e. the second CDS operation), the control circuit is arranged generate the select signal RSEL" and the reset signal RST" to turn on the FETs M5 and the FETs M3 of the pixel circuits in the pixel array 300. After the rolling readout operation, at time t8", the control circuit is arranged to generate the select signal RSEL" and the reset signal RST" to turn off the FETs M5 and the FETs M3 of the pixel circuits in the pixel array 300. It is noted that the rolling readout operation during the global shutter operation is similar to the above mentioned rolling readout operation, thus the detailed description is omitted here for brevity.

Figure 10:
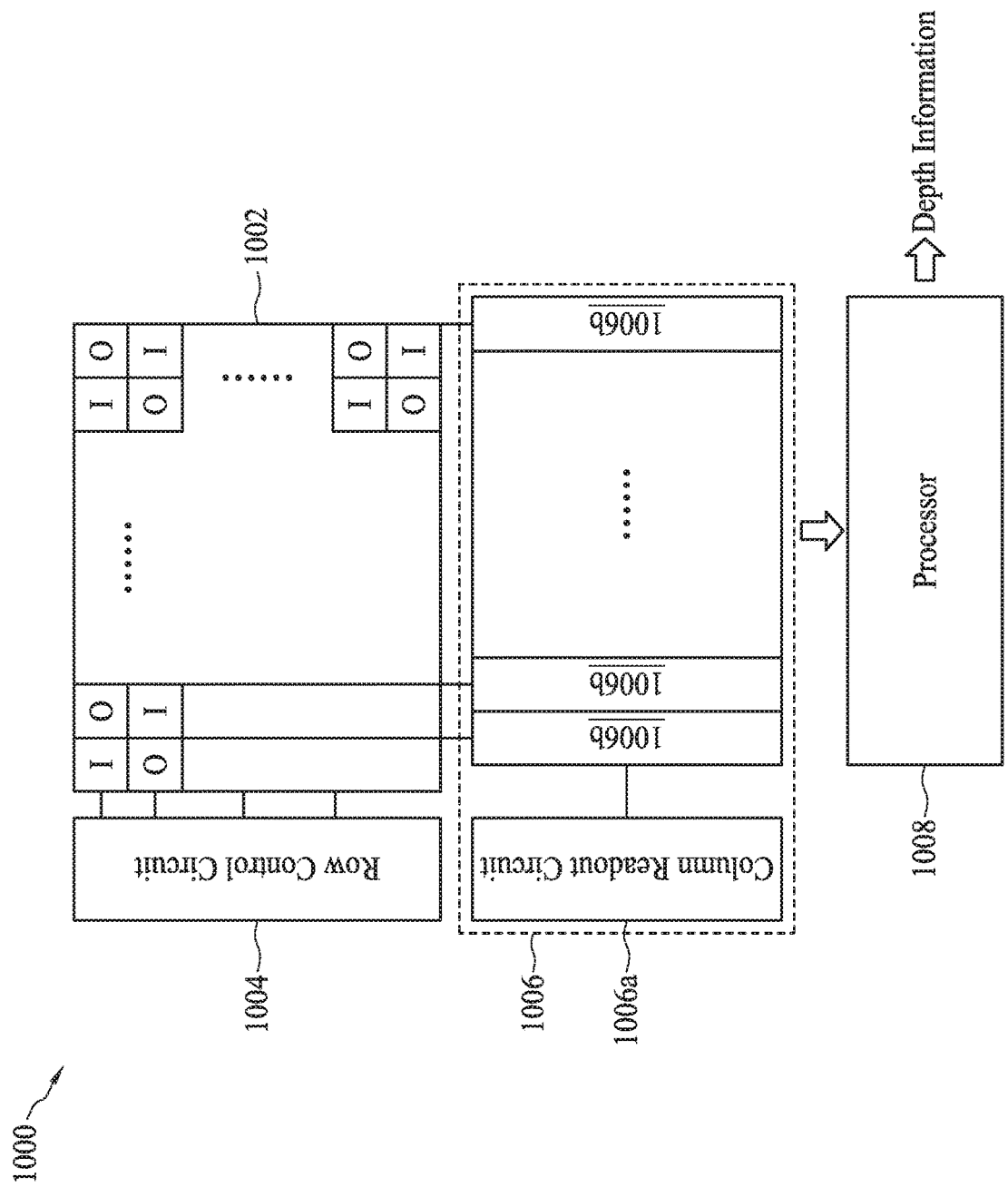
FIG. 10 is a diagram illustrating an image sensing device in accord with some embodiments.

FIG. 10 is a diagram illustrating an image sensing device 1000 in accordance with some embodiments. The image sensing device 1000 comprises a pixel array 1002, a row control circuit 1004, a column readout circuit 1006, and a processor 1008. The processor 1008 may be an interpolating circuit. The pixel array 1002 may be the above mentioned pixel array 300 or 600. For the purpose of description, the pixel array 1002 in this embodiment is the pixel array 300. The row control circuit 1004 is coupled to each row of the pixel array 1002 for controlling the pixel circuits in each row. The column readout circuit 1006 comprises a readout control circuit 1006a and a plurality of correlated double sampling circuits 1006b. The correlated double sampling circuits 1006h are coupled to the pixel columns of the pixel array 1002 respectively. The plurality of correlated double sampling circuits 1006b are arranged for reading the output signals (e.g. Si1 and So1 of the pixel circuit 302_1_1) of the pixel circuits in the pixel array 1002. The readout control circuit 1006a is coupled to the correlated double sampling circuits 1006b for controlling the operations of the correlated double sampling circuits 1006b. According to some embodiments, each correlated double sampling circuit 1006h may comprise an analog-to-digital converter (ADC) for converting the output signal (e.g. Si1 and So1 of the pixel circuit 302_1_1) of a pixel in analog form into a digital signal. The processor 1008 is arranged to perform the above mentioned interpolation operation (e.g. the equations (1) and (2) or the equations (3), (4), (5), and (6)) to obtain the depth information detected by each pixel in the pixel array 300. According to some embodiments, the processor 1008 may be an on-chip device integrated in the image sensing device 1000. In another embodiment, the interpolation operation of the image sensing device 1000 may be performed in an off-chip processor, in which the off-chip processor is arranged to perform the algorithm of interpolation operation based on the output signals of the pixel circuits in the pixel array 300.

Figure 11:
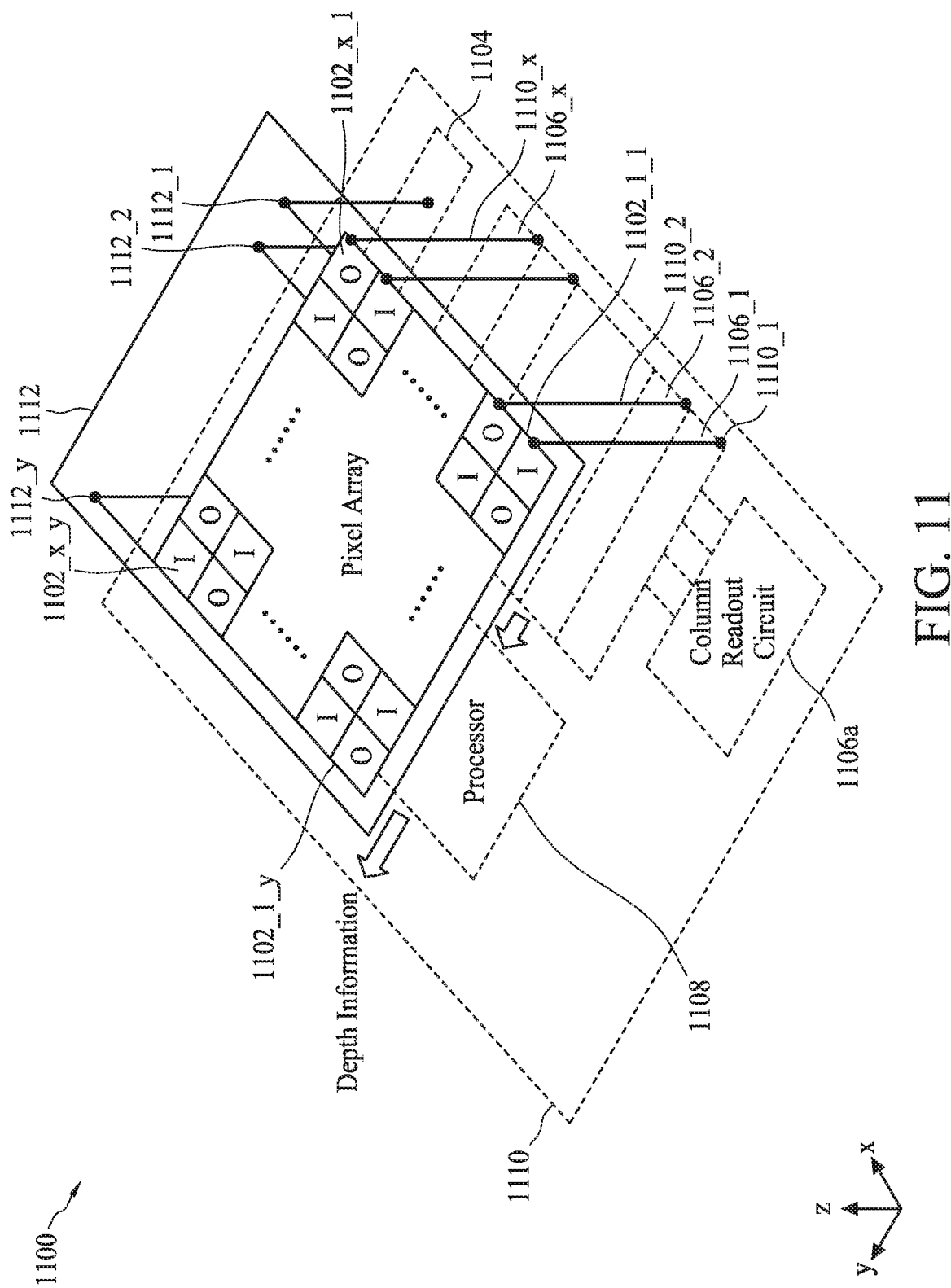
FIG. 11 is a diagram illustrating a three-dimensional structure of an image sensing device in accordance with some embodiments.

FIG. 11 is a diagram illustrating a three-dimensional (3D) structure of an image sensing device 1100 in accordance with some embodiments. The image sensing device 1100 comprises a pixel array having a plurality of pixel circuits 1102_1_1-1102_x_y, a row control circuit 1104, a column readout circuit having a readout control circuit 1106a and a plurality of correlated double sampling circuits 1106_1_1-1106_x, and a processor 1108. The processor 1108 may be an interpolating circuit. The interpolating circuit 1108 may be a processor. The image sensing device 1100 may be the 3D structure of the image sensing device 1000. In this embodiment, the pixel array, the row control circuit 1104, the column readout circuit 1106, and the processor 1108 are similar to the pixel array 1002, the row control circuit 1004, the column readout circuit 1006, and the processor 1008 respectively, thus the detailed description is omitted here for brevity.

According to some embodiments, the row control circuit 1104, the column readout circuit 1106, and the processor 1108 may be formed in or on a semiconductor substrate (or wafer) 1110, and pixel circuits 1102_1_1-1102_x_y may be formed in or on another semiconductor substrate (or wafer) 1112. The image sensing device 1100 further comprises a plurality of connecting structures 1110_1-1110_x for connecting the pixel columns 1102_1_1-1102_x_1 to the correlated double sampling circuits 1106_1_1-1106_x respectively, and a plurality of connecting structures 1112_1-1112_y for connecting the pixel rows 1102_x_1-1102_x_y to the row control circuit 1104. According to some embodiments, the pixel circuits 1102_1_1-1102_x_y (or the substrate 1112) is disposed on the top layer of the image sensing device 1100. The row control circuit 1104, the readout control circuit 1106a, the correlated double sampling circuits 1106_1_1-1106_x (or the substrate 1110) are disposed at the bottom layer of the image sensing device 1100. Moreover, the connecting structures 1110_1-1110_x and 1112_1-1112_y may be a plurality hybrid bonds arranged to bond the upper wafer (e.g. 1112) and the lower wafer (e.g. 1110).

More specifically, the connecting structures 1110_1-1110_x and 1112_1-1112_y are aligned with z-axis. According to some embodiments, the control signals generated by the row control circuit 1104 are transmitted to the pixel rows 1102_x_1-1102_x_y of the pixel array via the connecting structures 1112_1-1112_y respectively. The output signals generated by the pixel columns 1102_1_1-1102_x_1 of the pixel array are transmitted to the correlated double sampling circuits 1106_1_1-1106_x via the connecting structures 1110_1-1110_x respectively.

Figure 12:
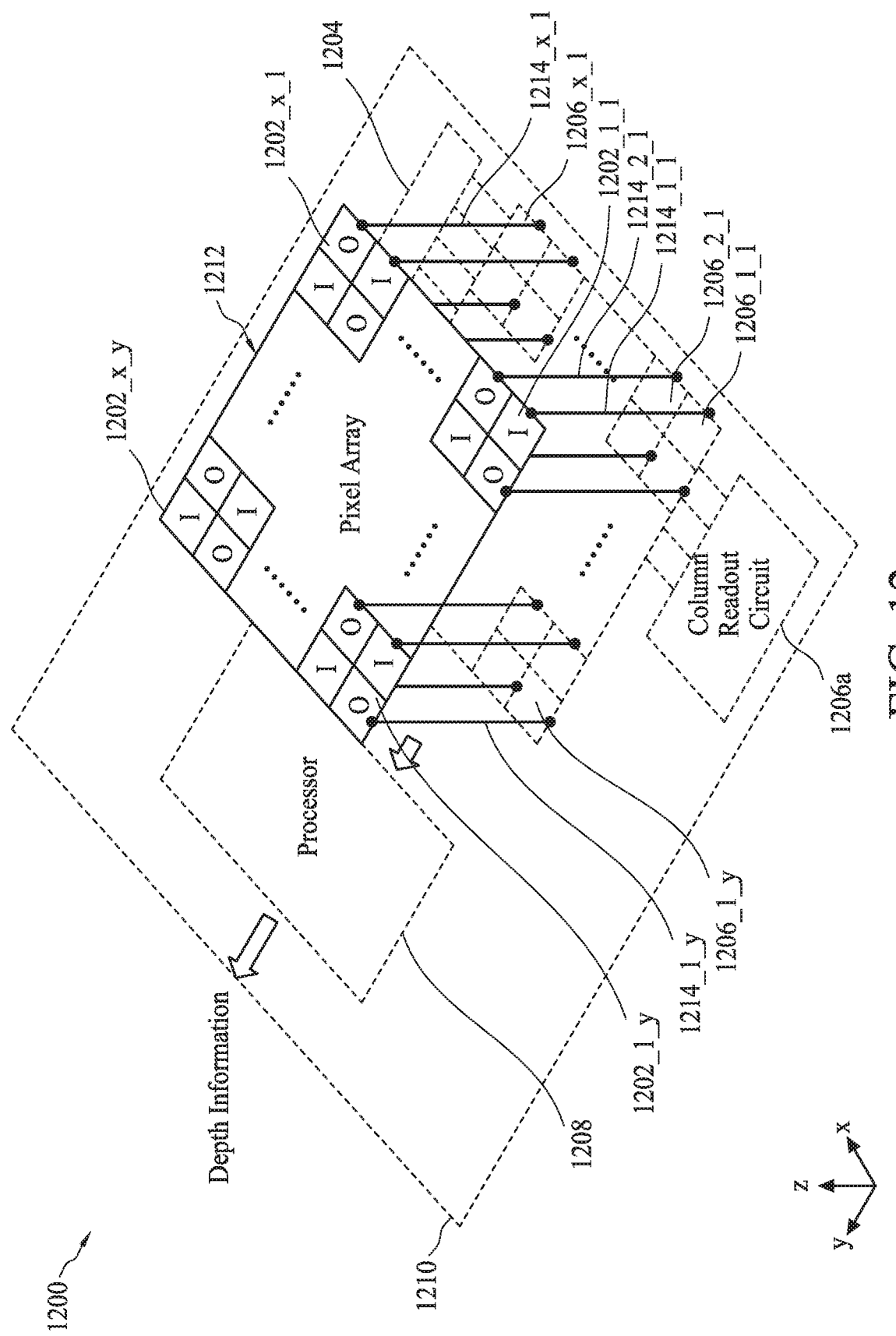
FIG. 12 is a diagram illustrating a three-dimensional structure of an image sensing device in accordance with some embodiments.

FIG. 12 is a diagram illustrating a three-dimensional (3D) structure of an image sensing device 1200 in accordance with some embodiments. The image sensing device 1200 comprises a pixel array having a plurality of pixel circuits 1202_1_1-1202_x_y, a row control circuit 1204, a readout circuit having a readout control circuit 1206a and a plurality of correlated double sampling circuits 1206_1_1-1206_x_y, and a processor 1208. The processor 1208 may be an interpolating circuit. The image sensing device 1200 may be the 3D structure of the image sensing device 1000.

In this embodiment, the pixel array, the row control circuit 1204, the readout control circuit 1206a, and the processor 1208 are similar to the pixel array 1002, the row control circuit 1004, the readout control circuit 1006a, and the processor 1008 respectively, thus the detailed description is omitted here for brevity. In comparison to the image sensing device 1100, the correlated double sampling circuits 1206_1_1-1206_x_y are arranged to be a circuit array corresponding to the pixel circuits 1202_1_1-1202_x_y respectively.

According to some embodiments, the row control circuit 1204, the readout control circuit 1206a, the correlated double sampling circuits 1206_1_1-1206_x_y, and the processor 1208 may be formed in or on a semiconductor substrate (or wafer) 1210, and the pixel circuits 1202_1_1-1202_x_y may be formed in or on another semiconductor substrate (or wafer) 1212. The image sensing device 1200 further comprises a plurality of connecting structures 1214_1_1-1214_x_y arranged for connecting the correlated double sampling circuits 1206_1_1-1206_x_y to the pixel circuits 1202_1_1-1202_x_y respectively. According to some embodiments, the pixel circuits 1202_1_1-1202_x_y (or the substrate 1212) are disposed on the top layer of the image sensing device 1200. The row control circuit 1204, the readout control circuit 1206a, the correlated double sampling circuits 1206_1_1-1206_x_y (or the substrate 1210) are disposed at the bottom layer of the image sensing device 1200. Moreover, the connecting structures 1214_1_1-1214_x_y may be a plurality hybrid bonds arranged to bond the upper wafer (e.g. 1212) and the lower wafer (e.g. 1210).

More specifically, the connecting structures 1214_1_1-1214_x_y are aligned with z-axis. The control signals generated by the row control circuit 1204 are transmitted to the pixel rows (e.g. 1202_x_1-1202_x_y) of the pixel array via the connecting structures 1214_x_1-1212_x_y respectively. The output signals generated by the pixel circuits 1202_1_1-1202_x_y of the pixel array 1202 are transmitted to the correlated double sampling circuits 1206_1_1-1206_x_y via the connecting structures 1214_1_1-1212_x_y respectively.

Figure 13:
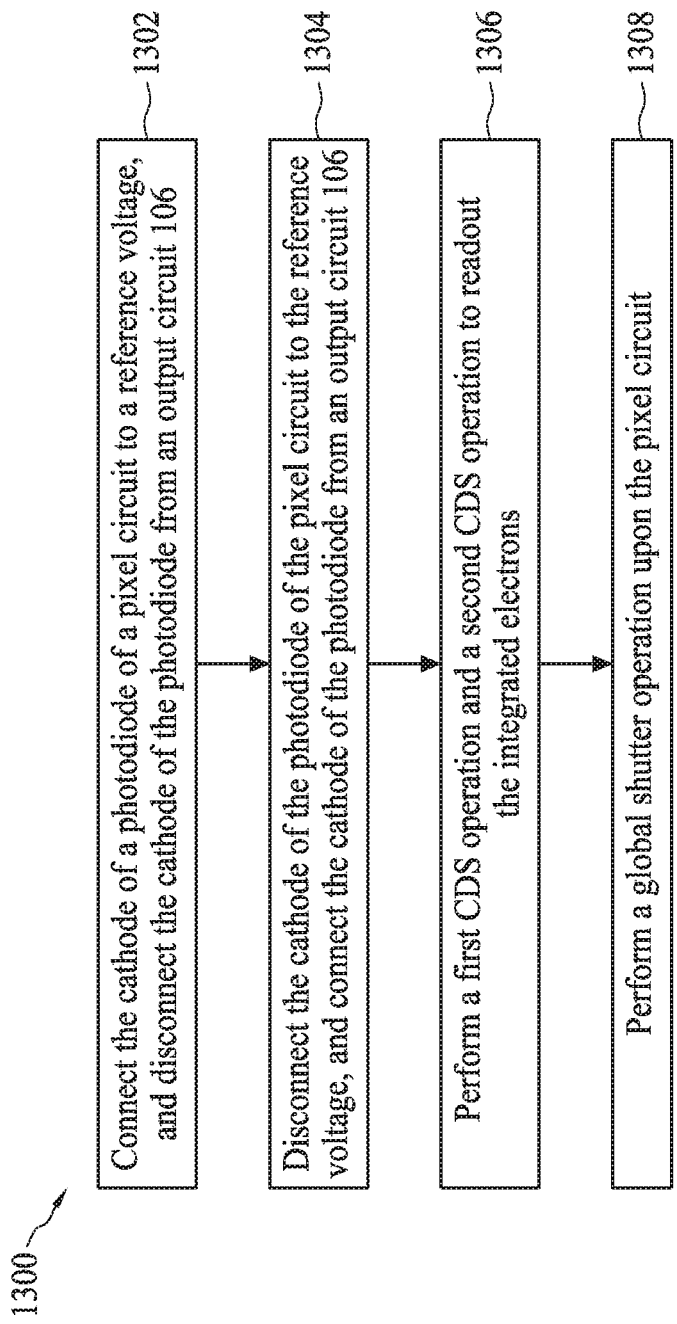
FIG. 13 is a flowchart of a method of operating a pixel circuit in a pixel array in accordance with some embodiments.

According to some embodiments, the operation of a pixel circuit in the pixel array may be summarized into the operations in FIG. 13. FIG. 13 is a flowchart of a method 1200 of operating a pixel circuit in the pixel array in accordance with some embodiments. For brevity, the pixel circuit may be the above mentioned pixel circuit 100. The method 1300 comprises operations 1302-1308.

In operation 1302, which may be the pixel blocking mode of the pixel circuit 100, the control signal Block is arranged to turn on the FET M1 of the pixel circuit 100 for connecting the cathode of the photodiode 102 of the pixel circuit 100 to the reference voltage RSTP, and the control signal TX is arranged to turn off the FET M2 of the pixel circuit 100 for disconnecting the cathode of the photodiode 102 from the output circuit 106. When the cathode of the photodiode 102 is connected to the reference voltage RSTP, the photodiode 102 may be reverse biased, and the photodiode 102 may operate under a photoconductive mode. Therefore, during the operation 1302, the electrical current generated by the photodiode 102 is blocked from the output circuit 106 of the pixel circuit 100.

In operation 1304, which may be the pixel integrating mode of the pixel circuit 100, the control signal Block is arranged to turn off the FET M1 for disconnecting the cathode of the photodiode 102 from the reference voltage RSTP, and the control signal TX is arranged to turn on the FET M2 for connecting the cathode of the photodiode 102 to the output circuit 106, i.e. the gate of the FET M4. When the cathode of the photodiode 102 is connected to the gate of the FET M4, the photodiode 102 may be zero biased, and the photodiode 102 may operate under a photovoltaic mode. Therefore, during the operation 1304, the electrical current generated by the photodiode 102 is integrated or stored on the gate of the FET M4. It is noted that the FETs M3 and M5 are opened during the pixel integrating mode.

In operation 1306, which may be the pixel outputting mode of the pixel circuit 100, the control signal TX is arranged to turn off the FET M2 for disconnecting the cathode of the photodiode 102 from the gate of the PET M4. Moreover, the pixel circuit 100 is configured to perform a first CDS operation and a second CDS operation to readout the electrical charges on the gate of the FET M4. For brevity, the detailed description of the first CDS operation and the second CDS operation are omitted here.

In operation 1308, which may be the global shutter operation of the pixel circuit 100, the gates of the FETs M1, M2, M3, and M4 of the pixel circuit 100 are controlled by the global shutter signal GS", the global control signal TX", the global reset signal RST", and the global select signal RSEL" respectively. According to some embodiments, the global shutter operation is divided into two stages, i.e. the global shutter integration operation and the rolling readout operation. For brevity, the detailed description of the global shutter integration operation and the rolling readout operation are omitted here.

Figure 14:
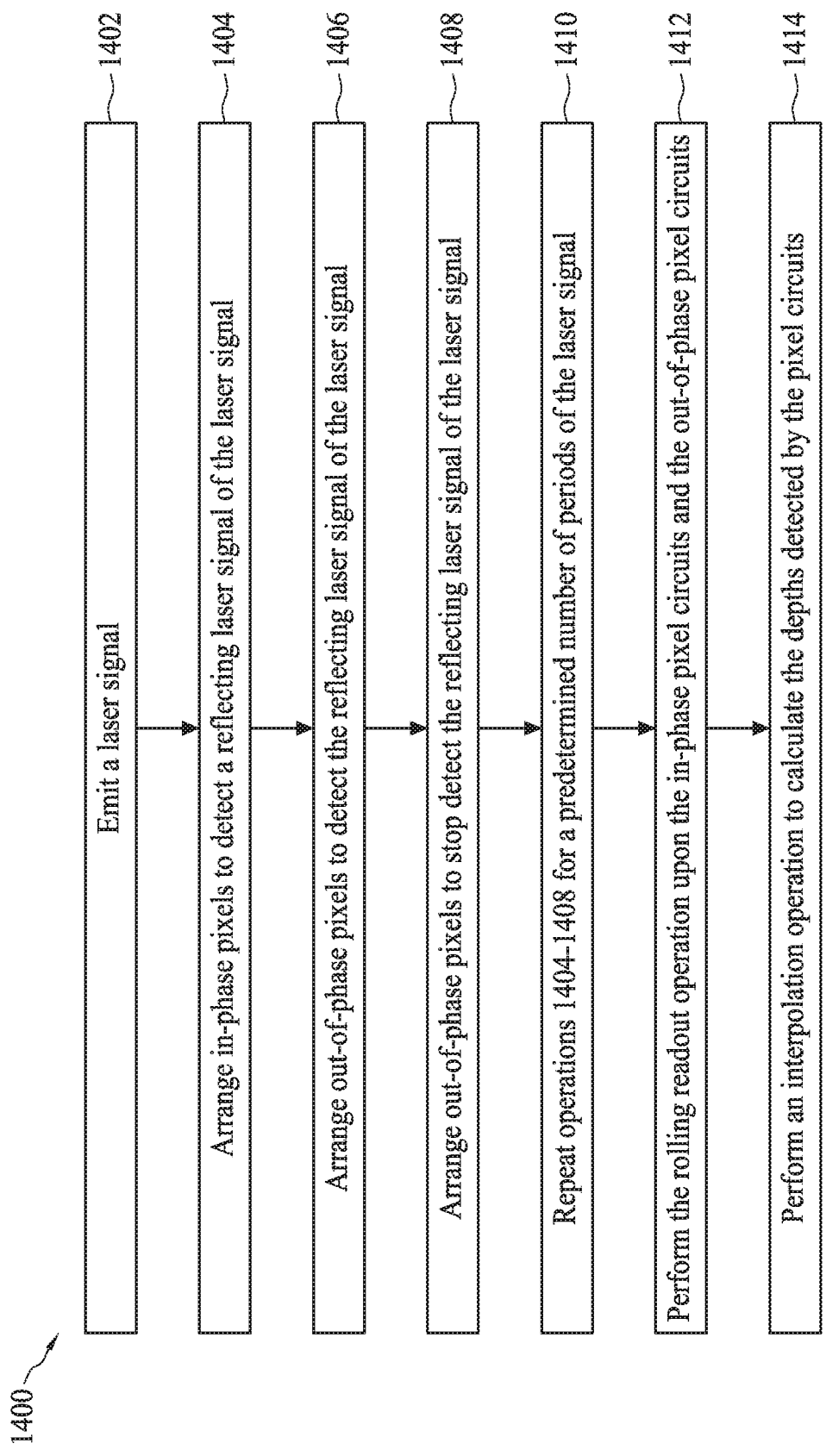
FIG. 14 is a flowchart of a method of calculating a depth detected by a pixel circuit in a pixel array in accordance with some embodiments.

According to some embodiments, the operation of calculating the depth detected by a pixel circuit in a pixel array 300 may be summarized into the operations in FIG. 14. FIG. 14 is a flowchart of a method 1400 of calculating the depth detected by a pixel circuit in a pixel array in accordance with some embodiments. For brevity, the pixel array may be the pixel array 300. The method 1400 comprises operations 1402-1414.

In operation 1402, at time t1, a laser emitting device is arranged to emit the laser signal S1.

In operation 1404, at time t1, the control circuit is arranged to generate the control signal TX1 to turn on the FETs M2 of the in-phase pixel circuits and to generate the control signal Block1 to turn off the FETs M1 of the in-phase pixel circuits, for detecting the reflecting laser signal Sr of the laser signal S1.

In operation 1406, at time t3, the control circuit is arranged to turn off and turn on the FETs M2 and the FETs M1 of the in-phase pixel circuits, and the control circuit is arranged to generate the control signal TX2 to turn on the FETs M2 of the out-of-phase pixel circuits 302_2_1 and to generate the control signal Block2 to turn off the FETs M1 of the out-of-phase pixel circuits, for detecting the reflecting laser signal Sr of the laser signal S1.

In operation 1408, at time t5, the control circuit is arranged to turn off and turn on the FETs M2 and the FETs M1 of the out-of-phase pixel circuits respectively.

In operation 1410, the control circuit lay repeat the above operations 1404-1408 of the in-phase pixel circuits and the out-of-phase pixel circuits for a predetermined number of periods of the laser signal S1 such that the electrons may be integrated or stored on the gates of the FETs M4 of the in-phase pixel circuits and the gates of the FETs M4 of the out-of-phase pixel circuits.

In operation 1412, the control circuit is arranged to perform the rolling readout operation upon the in-phase pixel circuits and the out-of-phase pixel circuits to obtain the electrical charges in the in-phase pixel circuits and the out-of-phase pixel circuits. The rolling readout operation may comprise the above mentioned first and second CDS operations, and the detailed description is omitted here for brevity.

In operation 1414, an interpolation operation is performed upon the electrical charges to calculate the depths detected by the pixel circuits $302\_1\_1$-$302\_x\_y$ according to the above mentioned equations (1)-(2). More specifically, for an in-phase pixel circuit, the depth detected by the in-phase pixel circuit is calculated by using the electrons integrated in the in-phase pixel circuit and the interpolation of the electrons integrated in the out-of-phase pixel circuits surrounding the in-phase pixel circuit. For an out-of-phase pixel circuit, the depth detected by the out-of-phase pixel circuit is calculated by using the electrons integrated in the out-of-phase pixel circuit and the interpolation of the electrons integrated in the in-phase pixel circuits surrounding the out-of-phase pixel circuit. The detailed description is omitted here for brevity.

Figure 15:
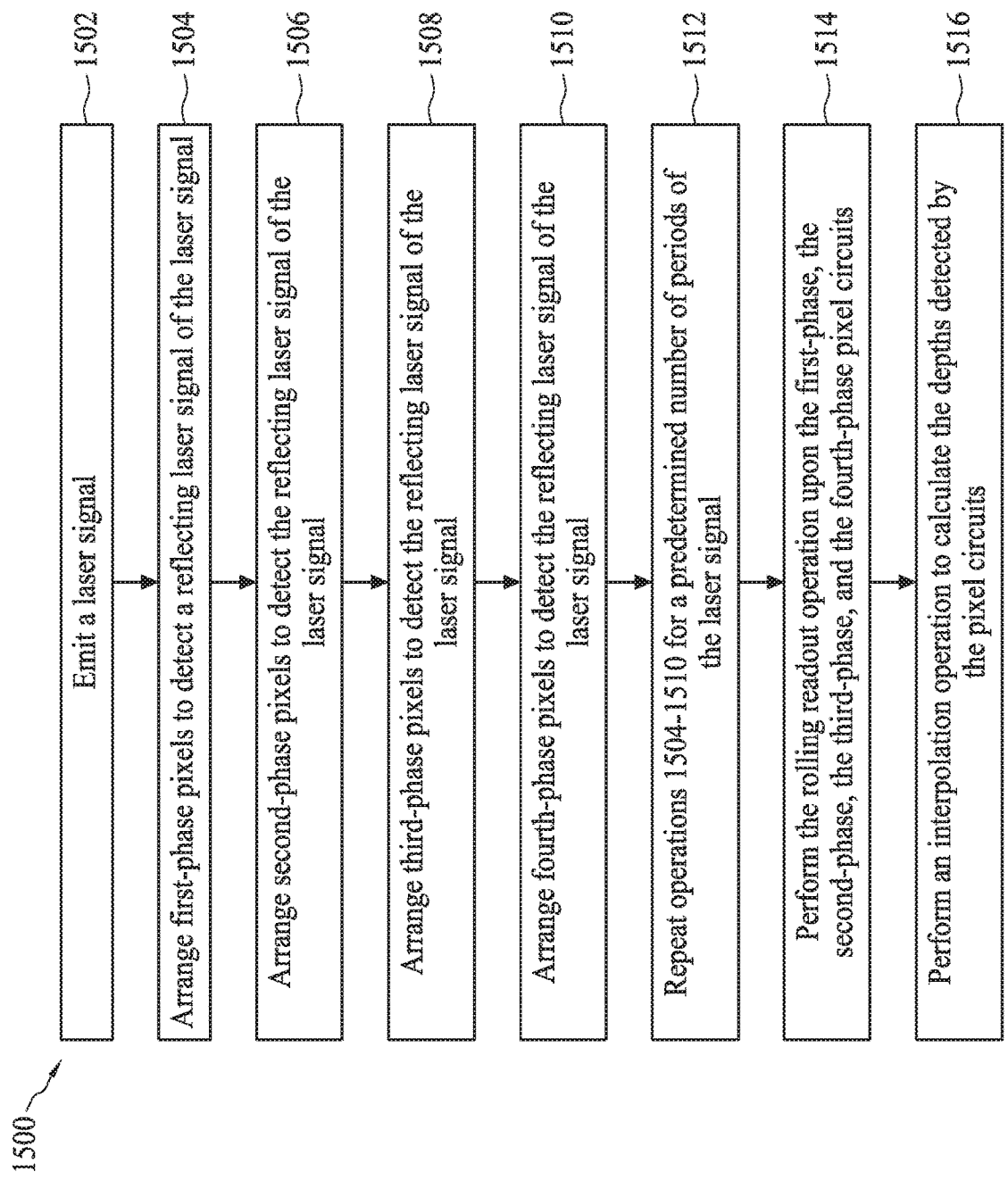
FIG. 15 is a flowchart of a method of calculating the depth detected by a pixel circuit in a pixel array in accordance with some embodiments.

According to some embodiments, the operation of calculating the depth detected by a pixel circuit in a pixel array 600 may be summarized into the operations in FIG. 15. FIG. 15 is a flowchart of a method 1500 of calculating the depth detected by a pixel circuit in a pixel array in accordance with some embodiments. For brevity, the pixel array may be the pixel array 600. The method 1500 comprises operations 1502-1516.

In operation 1502, at time t1', a laser emitting device is arranged to emit t laser signal SF.

In operation 1504, at time t1', the control circuit is arranged to generate the control signal TX1' to turn on the FETs M2 of the first-phase pixel circuits and to generate the control signal Block1' to turn off the FETs M1 of the first-phase pixel circuits, for detecting the reflecting laser signal Sr' of the laser signal S1'.

In operation 1506, at time t2', the control circuit is arranged to generate the control signal TX2' to turn on the FETs M2 of the second-phase pixel circuits and to generate the control signal Block2' to turn off the FETs M1 of the second-phase pixel circuits, for detecting the reflecting laser signal Sr' of the laser signal S1'.

In operation 1508, at time t4', the control circuit is arranged to generate the control signal TX3' to turn on the FETs M2 of the third-phase pixel circuits and to generate the control signal Block3' to turn off the FETs M1 of the third-phase pixel circuits, for detecting the reflecting laser signal Sr' of the laser signal S1'.

In operation 1510, at time t5', the control circuit is arranged to generate the control signal TX4' to turn on the FETs M2 of the fourth-phase pixel circuits and to generate the control signal Block4' to turn off the FETs M1 of the fourth-phase pixel circuits, for detecting the reflecting laser signal Sr' of the laser signal S1'.

In operation 1512, the control circuit may repeat the above operations 1504-1510 for a predetermined number of periods of the laser signal S1' such that the electrons may be integrated or stored on the gates of the FETs M4 of the first-phase pixel circuits, the second-phase pixel circuits, the third-phase pixel circuits, and the fourth-phase pixel circuits.

In operation 1514, the control circuit is arranged to perform the rolling readout operation upon the first-phase pixel circuits, the second-phase pixel circuits, the third-phase pixel circuits, and the fourth-phase pixel circuits to obtain the electrical charges in the first-phase pixel circuits, the second-phase pixel circuits, the third-phase pixel circuits, and the fourth-phase pixel circuits. The rolling readout operation may comprise the above mentioned first and second CDS operations, and the detailed description is omitted here for brevity.

In operation 1516, an interpolation operation is performed upon the electrical charges to calculate the depths detected by the pixel circuits 602_1_1-602_x_y according to the above mentioned equations (3)-(6).

More specifically, for a first-phase pixel circuit, the depth detected by the first-phase pixel circuit is calculated by using the electrons integrated in the first-phase pixel circuit and the interpolation of the electrons integrated in the second-phase pixel circuit, the third-phase pixel circuits, and the fourth-phase pixel circuits surrounding the first-phase pixel circuit. For a second-phase pixel circuit, the depth detected by the second-phase pixel circuit is calculated by using the electrons integrated in the second-phase pixel circuit and the interpolation of the electrons integrated in the first-phase pixel circuit, the fourth-phase pixel circuits, and the third-phase pixel circuits surrounding the second-phase pixel circuit. For a third-phase pixel circuit, the depth detected by the third-phase pixel circuit is calculated by using the electrons integrated in the third-phase pixel circuit and the interpolation of the electrons integrated in the fourth-phase pixel circuit, the first-phase pixel circuits, and the second-phase pixel circuits surrounding the third-phase pixel circuit. For a fourth-phase pixel circuit, the depth detected by the fourth-phase pixel circuit is calculated by using the electrons integrated in the fourth-phase pixel circuit and the interpolation of the electrons integrated in the third-phase pixel circuit, the second-phase pixel circuits, and the first-phase pixel circuits surrounding the fourth-phase pixel circuit. The detailed description is omitted here for brevity.

Briefly, in the present embodiments, each pixel circuit in the pixel array is composed of five transistors (5T), thus the pixel pitch in the pixel array is relatively small in comparison to the existing pixel circuit composed of eight transistors (8T). The pixel circuit is arranged to sample the reflected light signal with certain phase shift (e.g. 0, 90, 180, 270 degrees). An interpolation operation is performed upon the pixel circuit in the pixel array by using the signals surrounding the pixel circuit. Moreover, the present pixel array supports the global shutter image operation. Therefore, the pixel array may generate a 3D image by synthesizing the depth information of the pixel circuits and the result obtained in the global shutter image operation.

According to some embodiments, a pixel circuit is provided. The pixel circuit comprises a photodiode, a control circuit, and an output circuit. The photodiode is capable of generating electrical current according to an incoming light signal. The control circuit is coupled to the photodiode for selectively coupling a cathode of the photodiode to a first reference voltage to generate the electrical current according to a first control signal. The output circuit is coupled to the control circuit for selectively coupling a second reference voltage to a connecting terminal between the control circuit and the output circuit and to generate an output signal according to a reset signal and a select signal.

According to some embodiments, a sensing device is provided. The sensing device comprises a first pixel circuit, a second pixel circuit, a third pixel circuit, a fourth pixel circuit, and a fifth pixel circuit. The second pixel circuit is disposed on a first side of the first pixel circuit. The third pixel circuit is disposed on a second side of the first pixel circuit, wherein the second side of the first pixel circuit is opposite to the first side of the first pixel circuit. The fourth pixel circuit is disposed on a third side of the first pixel circuit. The fifth pixel circuit is disposed on a fourth side of the first pixel circuit, wherein the fourth side of the first pixel circuit is opposite to the third side of the first pixel circuit. The first pixel circuit is arranged to receive a reflecting laser signal of a laser signal during a first phase of the laser signal; the second pixel circuit, the third pixel circuit, the fourth pixel circuit, and the fifth pixel circuit are arranged to receive the reflecting laser signal during a second phase of the laser signal; and the second phase is different from the first phase.

According to some embodiments, a method of calculating a depth of a pixel array is provided. The pixel array comprises a plurality of pixel circuits. The method comprises: arranging a first pixel circuit to receive a reflecting laser signal of a laser signal during a first phase of the laser signal; arranging a second pixel circuit and the third pixel circuit to receive the reflecting laser signal during a second phase of the laser signal; arranging a fourth pixel circuit and the fifth pixel circuit to receive the reflecting laser signal during a third phase of the laser signal; and arranging a sixth pixel circuit, a seventh pixel circuit, an eighth pixel circuit, and a ninth pixel circuit to receive the reflecting laser signal during a fourth phase of the laser signal; wherein the first phase, the second phase, the third phase, and the fourth phase are different phases.

The foregoing outlines features of several embodiments so that those skilled in the art may better understand the aspects of the present disclosure, Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A pixel circuit, comprising:
 a photodiode, capable of generating electrical current according to an incoming light signal;
 a control circuit, coupled to the photodiode, for selectively coupling a cathode of the photodiode to a first reference voltage (RSTP) to generate the electrical current according to a first control signal; and
 an output circuit, coupled to the control circuit, for selectively coupling a second reference voltage (RSTV) to a connecting terminal between the control circuit and the output circuit and to generate an output signal according to a reset signal and a select signal, wherein the control circuit comprises:
- a first transistor, having a first connecting terminal coupled to the first reference voltage, a second connecting terminal coupled to the cathode of the photodiode, and a control terminal coupled to the first control signal; and
- a second transistor, having a first connecting terminal coupled to the cathode of the photodiode, a second connecting terminal coupled to the output circuit, and a control terminal coupled to a second control signal, wherein the second control signal is different from the first control signal.

2. The pixel circuit of claim 1, wherein when the first control signal is arranged to turn on the first transistor, the second control signal is arranged to turn off the second transistor, and when the first control signal is arranged to turn off the first transistor, the second control signal is arranged to turn on the second transistor.

3. The pixel circuit of claim 1, wherein the first transistor and the second transistor are n-type field-effect transistors.

4. The pixel circuit of claim 1, wherein the output circuit comprises:
- a third transistor, having a first connecting terminal coupled to the second reference voltage (RSTV), a second connecting terminal coupled to the second connecting terminal of the second transistor, and a control terminal coupled to the reset signal;
- a fourth transistor, having a first connecting terminal coupled to a third reference voltage, a control terminal coupled to the second connecting terminal of the third transistor; and
- a fifth transistor, having a first connecting terminal coupled to a second connecting terminal of the fourth transistor, a second connecting terminal coupled to an output terminal, and a control terminal coupled to a select signal.

5. The pixel circuit of claim 4, wherein the select signal is arranged to turn on the fifth transistor for a first time interval, the reset signal is arranged to turn on the third transistor for a second time interval, and the first time interval is greater than the second time interval.

6. The pixel circuit of claim 4, wherein the third transistor, the fourth transistor, and the fifth transistor are n-type field-effect transistors.

7. A sensing device, comprising:
- a first pixel circuit;
- a second pixel circuit, disposed on a first side of the first pixel circuit;
- a third pixel circuit, disposed on a second side of the first pixel circuit, wherein the second side of the first pixel circuit is opposite to the first side of the first pixel circuit;
- a fourth pixel circuit, disposed on a third side of the first pixel circuit;
- a fifth pixel circuit, disposed on a fourth side of the first pixel circuit, wherein the fourth side of the first pixel circuit is opposite to the third side of the first pixel circuit;

wherein the first pixel circuit is arranged to receive a reflecting laser signal of a laser signal during a first phase of the laser signal; the second pixel circuit, the third pixel circuit, the fourth pixel circuit, and the fifth pixel circuit are arranged to receive the reflecting laser signal during a second phase of the laser signal; and the second phase is different from the first phase.

8. The sensing device of claim 7, wherein each of the first pixel circuit, the second pixel circuit, the third pixel circuit, the fourth pixel circuit, and the fifth pixel circuit comprises:
- a photodiode, capable of generating electrical current according to the reflecting laser signal;
- a control circuit, coupled to the photodiode, for selectively coupling a cathode of the photodiode to a reference voltage (RSTP) to generate the electrical current according to a first control signal; and
- an output circuit, coupled to the control circuit, for accumulating the electrical current generated by the photodiode to generate an output signal.

9. The sensing device of claim 7, wherein the first phase and the second phase are 180 degrees out-of-phase.

10. The sensing device of claim 7, further comprising:
- a processor, coupled to the first pixel, the second pixel, the third, pixel, the fourth pixel, and the fifth pixel, for calculating a depth detected by the first pixel according to a first electrical charges, a second electrical charges, a third electrical charges, a fourth electrical charges, and a fifth electrical charges of the first pixel circuit, the second pixel circuit, the third, pixel circuit, the fourth pixel circuit, and the fifth pixel circuit respectively.

11. The sensing device of claim 10, wherein when the first phase is in-phase with the laser signal, the second phase is 180 degrees out-of-phase to the laser signal, the processor is arranged to calculate the depth according to an equation (1):

$$\text{Depth\_odd} = \frac{1}{2} * S * Tp * \left( \frac{O1 + O2 + O3 + O4}{4*I + O1 + O2 + O3 + O4} \right),$$

wherein the parameter Depth_odd is the depth, the parameter S is a speed of the laser signal, the parameter Tp is a pulse width of the laser signal, the parameter I is the first electrical charges, the parameters O1, O2, O3, and O4 are the second electrical charges, the third electrical charges, the fourth electrical charges, and the fifth electrical charges respectively.

12. The sensing device of claim 10, wherein when the first phase is 180 degrees out-of-phase to the laser signal, the second phase is in-phase with the laser signal, the processor is arranged to calculate the depth according to an equation (2):

$$\text{Depth\_even} = \frac{1}{2} * S * Tp * \left( \frac{4*O}{I1 + I2 + I3 + I4 + 4*O} \right),$$

wherein the parameter Depth_even is the depth, the parameter S is a speed of the laser signal, the parameter Tp is a pulse width of the laser signal, the parameter O is the first electrical charges, the parameters I1, I2, I3, and I4 are the second electrical charges, the third electrical charges, the fourth electrical charges, and the fifth electrical charges respectively.

13. A method of calculating a depth of a pixel array, wherein the pixel array comprises a plurality of pixel circuits, and the method comprising:
- arranging a first pixel circuit to receive a reflecting laser signal of a laser signal during a first phase of the laser signal;
- arranging a second pixel circuit and the third pixel circuit to receive the reflecting laser signal during a second phase of the laser signal;

arranging a fourth pixel circuit and a fifth pixel circuit to receive the reflecting laser signal during a third phase of the laser signal; and arranging a sixth pixel circuit, a seventh pixel circuit, an eighth pixel circuit, and a ninth pixel circuit to receive the reflecting laser signal during a fourth phase of the laser signal;

wherein the first phase, the second phase, the third phase, and the fourth phase are different phases.

14. The method of claim 13, wherein the first phase and the second phase are 90 degrees out-of-phase, the first phase and the third phase are 180 degrees out-of-phase, the first phase and the fourth phase are 270 degrees out-of-phase.

15. The method of claim 13, further comprising:

calculating a depth detected by the first pixel according to a first electrical charges, a second electrical charges, a third electrical charges, a fourth electrical charges, a fifth electrical charges, a sixth electrical charges, a seventh electrical charges, an eighth electrical charges, and a ninth electrical charges of the first pixel circuit, the second pixel circuit, the third, pixel circuit, the fourth pixel circuit, the fifth pixel circuit, the sixth pixel circuit, the seventh pixel circuit, the eighth pixel circuit, and the ninth pixel circuit, respectively.

16. The method of claim 15, wherein when the first phase is in-phase with the laser signal, the second phase is 90 degrees out-of-phase to the laser signal, the third phase is 180 degrees out-of-phase to the laser signal, and the fourth phase is 270 degrees out-of-phase to the laser signal, the step of calculating the depth detected by the first pixel comprises:

calculating the depth according to a ratio of first different electrons and second different electrons;

wherein the first different electrons is obtained according to a total of the sixth electrical charges, the seventh electrical charges, the eighth electrical charges, and the ninth electrical charges, and a total of the second electrical charges and the third electrical charges; and the second different electrons is obtained according to a total of the fourth electrical charges and the fifth electrical charges and the first electrical charges.

17. The method of claim 15, wherein when the first phase is 90 degrees out-of-phase to the laser signal, the second phase is in-phase with the laser signal, the third phase is 270 degrees out-of-phase to the laser signal, and the fourth phase is 180 degrees out-of-phase to the laser signal, the step of calculating the depth detected by the first pixel comprises:

calculating the depth according to a ratio of first different electrons and second different electrons;

wherein the first different electrons is obtained according to a total of the fourth electrical charges and the fifth electrical charges, and the first electrical charges; and the second different electrons is obtained according to a total of the sixth electrical charges, the seventh electrical charges, the eighth electrical charges, and the ninth electrical charges and a total of the second electrical charges and the third electrical charges.

18. The method of claim 15, wherein when the first phase is 180 degrees out-of-phase to the laser signal, the second phase is 270 degrees out-of-phase to the laser signal, the third phase is in-phase with the laser signal, and the fourth phase is 90 degrees out-of-phase to the laser signal, the step of calculating the depth detected by the first pixel comprises:

calculating the depth according to a ratio of first different electrons and second different electrons;

wherein the first different electrons is obtained according to a total of the second electrical charges and the third electrical charges, and a total of the sixth electrical charges, the seventh electrical charges, the eighth electrical charges, and the ninth electrical charges; and the second different electrons is obtained according to the first electrical charges and a total of the fourth electrical charges and the fifth electrical charges.

19. The method of claim 15, wherein when the first phase is 270 degrees out-of-phase to the laser signal, the second phase is 180 degrees out-of-phase to the laser signal, the third phase is 90 degrees out-of-phase to the laser signal, and the fourth phase is in-phase with the laser signal, the step of calculating the depth detected by the first pixel comprises:

calculating the depth according to a ratio of first different electrons and second different electrons;

wherein the first different electrons is obtained according to the first electrical charges and a total of the fourth electrical charges and the fifth electrical charges; and the second different electrons is obtained according to a total of the second electrical charges and the third electrical charges, and a total of the sixth electrical charges, the seventh electrical charges, the eighth electrical charges, and the ninth electrical charges.

20. The method of claim 13, wherein the arranging of the first pixel circuit to receive the reflecting laser signal of the laser signal comprises configuring a control circuit of the first pixel circuit to receive the reflecting laser signal by a photodiode of the first pixel circuit.

\* \* \* \* \*